(12) United States Patent
Watanabe et al.

(10) Patent No.: US 9,660,092 B2
(45) Date of Patent: May 23, 2017

(54) OXIDE SEMICONDUCTOR THIN FILM TRANSISTOR INCLUDING OXYGEN RELEASE LAYER

(75) Inventors: Masahiro Watanabe, Tochigi (JP); Mitsuo Mashiyama, Oyama (JP); Takuya Handa, Tochigi (JP); Kenichi Okazaki, Tochigi (JP); Shunpei Yamazaki, Setagaya (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 13/592,942

(22) Filed: Aug. 23, 2012

(65) Prior Publication Data
US 2013/0048978 A1 Feb. 28, 2013

(30) Foreign Application Priority Data
Aug. 31, 2011 (JP) .................................. 2011-189739

(51) Int. Cl.
*H01L 29/786* (2006.01)
*H01L 29/66* (2006.01)
*H01L 29/49* (2006.01)

(52) U.S. Cl.
CPC ...... *H01L 29/7869* (2013.01); *H01L 29/4908* (2013.01); *H01L 29/66742* (2013.01); *H01L 29/78696* (2013.01)

(58) Field of Classification Search
None
See application file for complete search history.

(56) References Cited

U.S. PATENT DOCUMENTS

| 5,198,379 A | 3/1993 | Adan |
| 5,528,032 A | 6/1996 | Uchiyama |
| (Continued) | | |

FOREIGN PATENT DOCUMENTS

| EP | 1737044 A | 12/2006 |
| EP | 2226847 A | 9/2010 |
| (Continued) | | |

OTHER PUBLICATIONS

Archived wikipedia.org/wiki/Aluminum_oxide.*
(Continued)

*Primary Examiner* — Zandra Smith
*Assistant Examiner* — Molly Reida
(74) *Attorney, Agent, or Firm* — Robinson Intellectual Property Law Office; Eric J. Robinson

(57) ABSTRACT

Provided is a semiconductor device including an oxide semiconductor and having stable electrical characteristics. Specifically, a semiconductor device including an oxide semiconductor and including a gate insulating film with favorable characteristics is provided. Further, a method for manufacturing the semiconductor device is provided. The semiconductor device includes a gate electrode, a gate insulating film over the gate electrode, an oxide semiconductor film over the gate insulating film, and a source electrode and a drain electrode in contact with the oxide semiconductor film. The gate insulating film includes at least a silicon oxynitride film and an oxygen release type oxide film which is formed over the silicon oxynitride film. The oxide semiconductor film is formed on and in contact with the oxygen release type oxide film.

11 Claims, 15 Drawing Sheets

(56) References Cited

U.S. PATENT DOCUMENTS

| | | |
|---|---|---|
| 5,644,147 A | 7/1997 | Yamazaki et al. |
| 5,661,050 A | 8/1997 | Boer et al. |
| 5,731,856 A | 3/1998 | Kim et al. |
| 5,744,864 A | 4/1998 | Cillessen et al. |
| 5,818,070 A | 10/1998 | Yamazaki et al. |
| 5,847,410 A | 12/1998 | Nakajima |
| 5,872,370 A | 2/1999 | Gu et al. |
| 5,923,963 A | 7/1999 | Yamanaka |
| 6,270,619 B1 | 8/2001 | Suzuki et al. |
| 6,294,274 B1 | 9/2001 | Kawazoe et al. |
| 6,294,799 B1 | 9/2001 | Yamazaki et al. |
| 6,300,683 B1 | 10/2001 | Nagasaka et al. |
| 6,563,174 B2 | 5/2003 | Kawasaki et al. |
| 6,586,346 B1 | 7/2003 | Yamazaki et al. |
| 6,657,692 B2 | 12/2003 | Shiota |
| 6,686,228 B2 | 2/2004 | Suzawa et al. |
| 6,727,522 B1 | 4/2004 | Kawasaki et al. |
| 6,900,462 B2 | 5/2005 | Suzawa et al. |
| 6,939,731 B2 | 9/2005 | Ishizaki |
| 6,960,812 B2 | 11/2005 | Yamazaki et al. |
| 6,962,879 B2 | 11/2005 | Zhu et al. |
| 6,982,194 B2 | 1/2006 | Tsunoda et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,348,631 B2 | 3/2008 | Hotta |
| 7,385,224 B2 | 6/2008 | Ishii et al. |
| 7,397,130 B2 | 7/2008 | Lee |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,580,276 B2 | 8/2009 | Sawa et al. |
| 7,582,904 B2 | 9/2009 | Fujii et al. |
| 7,595,143 B2 | 9/2009 | Park et al. |
| 7,611,930 B2 | 11/2009 | Yamazaki et al. |
| 7,633,085 B2 | 12/2009 | Suzawa et al. |
| 7,642,573 B2 | 1/2010 | Hoffman et al. |
| 7,674,650 B2 | 3/2010 | Akimoto et al. |
| 7,732,819 B2 | 6/2010 | Akimoto et al. |
| 7,767,505 B2 | 8/2010 | Son et al. |
| 7,781,335 B2 | 8/2010 | Isono |
| 7,791,072 B2 | 9/2010 | Kumomi et al. |
| 7,872,722 B2 | 1/2011 | Kimura |
| 7,884,360 B2 | 2/2011 | Takechi et al. |
| 7,923,287 B2 | 4/2011 | Lee et al. |
| 7,940,345 B2 | 5/2011 | Yamazaki |
| 8,022,405 B2 | 9/2011 | Yamazaki |
| 8,030,655 B2 | 10/2011 | Yamazaki |
| 8,063,421 B2 | 11/2011 | Kang et al. |
| 8,093,136 B2 | 1/2012 | Endo et al. |
| 8,093,591 B2 | 1/2012 | Suzawa et al. |
| 8,129,717 B2 | 3/2012 | Yamazaki et al. |
| 8,143,115 B2 | 3/2012 | Omura et al. |
| 8,143,678 B2 | 3/2012 | Kim et al. |
| 8,148,721 B2 | 4/2012 | Hayashi et al. |
| 8,202,365 B2 | 6/2012 | Umeda et al. |
| 8,212,953 B2 | 7/2012 | Hosoya |
| 8,274,078 B2 | 9/2012 | Itagaki et al. |
| 8,293,595 B2 | 10/2012 | Yamazaki et al. |
| 8,324,626 B2 | 12/2012 | Kimura et al. |
| 8,384,077 B2 | 2/2013 | Yano et al. |
| 8,420,442 B2 | 4/2013 | Takechi et al. |
| 8,461,594 B2 | 6/2013 | Morosawa et al. |
| 8,502,217 B2 | 8/2013 | Sato et al. |
| 8,518,740 B2 | 8/2013 | Yamazaki et al. |
| 8,547,493 B2 | 10/2013 | Yamazaki et al. |
| 8,704,217 B2 | 4/2014 | Yano et al. |
| 8,729,544 B2 | 5/2014 | Yamazaki et al. |
| 8,742,418 B2 | 6/2014 | Morosawa et al. |
| 9,087,745 B2 | 7/2015 | Yamazaki et al. |
| 9,111,804 B2 | 8/2015 | Yamazaki et al. |
| 2001/0008157 A1 | 7/2001 | Bishop et al. |
| 2001/0046027 A1 | 11/2001 | Tai et al. |
| 2001/0049163 A1 | 12/2001 | Yamazaki et al. |
| 2002/0056838 A1 | 5/2002 | Ogawa |
| 2002/0126243 A1 | 9/2002 | Hibino et al. |
| 2002/0132454 A1 | 9/2002 | Ohtsu et al. |
| 2003/0189401 A1 | 10/2003 | Kido et al. |
| 2003/0218166 A1 | 11/2003 | Tsutsui |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0195574 A1 | 10/2004 | Ahn et al. |
| 2004/0261709 A1 | 12/2004 | Sakata |
| 2005/0017302 A1 | 1/2005 | Hoffman |
| 2005/0122443 A1 | 6/2005 | Kim et al. |
| 2005/0163938 A1 | 7/2005 | Yamazaki et al. |
| 2005/0199959 A1 | 9/2005 | Chiang et al. |
| 2005/0263767 A1 | 12/2005 | Yamazaki et al. |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0020903 A1 | 1/2007 | Takehara et al. |
| 2007/0024187 A1 | 2/2007 | Shin et al. |
| 2007/0046191 A1 | 3/2007 | Saito |
| 2007/0048662 A1 | 3/2007 | Park et al. |
| 2007/0051952 A1 | 3/2007 | Yamazaki et al. |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0254456 A1 | 11/2007 | Maruyama et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0023698 A1 | 1/2008 | Li et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0142797 A1 | 6/2008 | Lee et al. |
| 2008/0166834 A1 | 7/2008 | Kim et al. |
| 2008/0182358 A1 | 7/2008 | Cowdery-Corvan et al. |
| 2008/0203387 A1 | 8/2008 | Kang et al. |

(56) References Cited

U.S. PATENT DOCUMENTS

| | | |
|---|---|---|
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0318394 A1 | 12/2008 | Kakehata et al. |
| 2009/0001375 A1 | 1/2009 | Yamazaki et al. |
| 2009/0002591 A1 | 1/2009 | Yamazaki et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0191672 A1 | 7/2009 | Kunii |
| 2009/0278122 A1 | 11/2009 | Hosono et al. |
| 2009/0280600 A1 | 11/2009 | Hosono et al. |
| 2009/0321731 A1 | 12/2009 | Jeong et al. |
| 2010/0025675 A1 | 2/2010 | Yamazaki et al. |
| 2010/0025676 A1 | 2/2010 | Yamazaki et al. |
| 2010/0025677 A1* | 2/2010 | Yamazaki et al. ............ 257/43 |
| 2010/0025679 A1 | 2/2010 | Yamazaki et al. |
| 2010/0051938 A1 | 3/2010 | Hayashi et al. |
| 2010/0051940 A1* | 3/2010 | Yamazaki et al. ............ 257/43 |
| 2010/0065844 A1 | 3/2010 | Tokunaga |
| 2010/0084649 A1 | 4/2010 | Seo et al. |
| 2010/0090217 A1 | 4/2010 | Akimoto |
| 2010/0092800 A1 | 4/2010 | Itagaki et al. |
| 2010/0109002 A1 | 5/2010 | Itagaki et al. |
| 2010/0117075 A1 | 5/2010 | Akimoto et al. |
| 2010/0127266 A1 | 5/2010 | Saito et al. |
| 2010/0163868 A1* | 7/2010 | Yamazaki et al. ............ 257/43 |
| 2010/0224871 A1 | 9/2010 | Yamaguchi |
| 2010/0283049 A1 | 11/2010 | Sato et al. |
| 2010/0285632 A1 | 11/2010 | Inoue et al. |
| 2010/0295041 A1 | 11/2010 | Kumomi et al. |
| 2010/0295042 A1 | 11/2010 | Yano et al. |
| 2010/0320458 A1 | 12/2010 | Umeda et al. |
| 2010/0320459 A1 | 12/2010 | Umeda et al. |
| 2011/0003427 A1 | 1/2011 | Sasaki et al. |
| 2011/0003430 A1 | 1/2011 | Yamazaki et al. |
| 2011/0006301 A1 | 1/2011 | Yamazaki et al. |
| 2011/0008930 A1 | 1/2011 | Sasaki et al. |
| 2011/0012104 A1* | 1/2011 | Kang ............ H01L 27/12 257/43 |
| 2011/0031498 A1 | 2/2011 | Kimura et al. |
| 2011/0042677 A1 | 2/2011 | Suzuki et al. |
| 2011/0079777 A1 | 4/2011 | Akimoto |
| 2011/0079784 A1 | 4/2011 | Im |
| 2011/0092017 A1 | 4/2011 | Akimoto et al. |
| 2011/0095288 A1 | 4/2011 | Morosawa et al. |
| 2011/0101335 A1 | 5/2011 | Yamazaki et al. |
| 2011/0175090 A1 | 7/2011 | Sugihara et al. |
| 2011/0180802 A1 | 7/2011 | Morosawa et al. |
| 2011/0198603 A1* | 8/2011 | Choi et al. ............ 257/66 |
| 2011/0212569 A1 | 9/2011 | Yamazaki et al. |
| 2011/0297930 A1 | 12/2011 | Choi et al. |
| 2012/0001170 A1 | 1/2012 | Yamazaki |
| 2012/0032193 A1 | 2/2012 | Kurokawa et al. |
| 2012/0126227 A1 | 5/2012 | Maeda et al. |
| 2012/0132908 A1 | 5/2012 | Sugihara et al. |
| 2012/0168750 A1 | 7/2012 | Hayashi et al. |
| 2012/0231580 A1 | 9/2012 | Yamazaki et al. |
| 2012/0252160 A1 | 10/2012 | Yamazaki |
| 2012/0252173 A1 | 10/2012 | Imoto et al. |
| 2012/0273779 A1 | 11/2012 | Yamazaki et al. |
| 2012/0273780 A1 | 11/2012 | Yamazaki et al. |
| 2012/0280230 A1 | 11/2012 | Akimoto et al. |
| 2012/0319101 A1 | 12/2012 | Sasagawa et al. |
| 2013/0043466 A1 | 2/2013 | Nomura et al. |
| 2013/0048977 A1 | 2/2013 | Watanabe et al. |
| 2013/0208207 A1 | 8/2013 | Okamoto et al. |
| 2013/0328044 A1 | 12/2013 | Yamazaki et al. |
| 2014/0367682 A1 | 12/2014 | Yamazaki et al. |
| 2015/0084048 A1 | 3/2015 | Hayashi et al. |
| 2015/0349099 A1 | 12/2015 | Yamazaki et al. |

FOREIGN PATENT DOCUMENTS

| | | |
|---|---|---|
| JP | S60-17962 A1 | 1/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | H01-309378 A1 | 12/1989 |
| JP | H04-25178 A1 | 1/1992 |
| JP | 05-251705 A | 9/1993 |
| JP | H07-92491 A1 | 4/1995 |
| JP | 08-264794 A | 10/1996 |
| JP | H11-40813 A1 | 2/1999 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-037268 A1 | 2/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165527 A1 | 6/2006 |
| JP | 2006-165528 A | 6/2006 |
| JP | 2006-229185 A1 | 8/2006 |
| JP | 2007-073562 A | 3/2007 |
| JP | 2007-096055 A1 | 4/2007 |
| JP | 2007-150158 A1 | 6/2007 |
| JP | 2009-135380 A | 6/2009 |
| JP | 2010-056539 A | 3/2010 |
| JP | 2010-114413 A | 5/2010 |
| JP | 2011-029629 A | 2/2011 |
| JP | 2011-100990 A | 5/2011 |
| JP | 2011-119706 A | 6/2011 |
| KR | 2008-0052107 A1 | 6/2008 |
| WO | WO-2004/114391 | 12/2004 |
| WO | WO-2008/069056 | 6/2008 |
| WO | WO-2008/069255 | 6/2008 |
| WO | WO-2009/091013 | 7/2009 |
| WO | WO-2009/093625 | 7/2009 |
| WO | WO-2011/043164 | 4/2011 |
| WO | WO-2011/052384 | 5/2011 |

OTHER PUBLICATIONS

Silicon oxide. Wikipedia.org. Feb. 7, 2015. Jan. 27, 2016.*
Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.
Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.
Ikeda.T et al., "Full-Functional System Liquid Crystal Display Using CG-Silicon Technology,", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

(56) References Cited

OTHER PUBLICATIONS

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

(56) References Cited

OTHER PUBLICATIONS

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

A. Bougrine et al. , Effect of tin incorporation on physicochemical properties of ZnO films prepared by spray pyrolysis, *Mater. Chem. Phys.* , 2005, vol. 91, Issues 2-3, pp. 247-252.

Jong H. Na, et al. , "High field-effect mobility amorphous InGaZnO transistors with aluminum electrodes", *Appl. Phys. Lett.* , 2008, vol. 93, Issue 6, 063501, pp. 063501-1-063501-3.

Song I. et al. , "Short Channel Characteristics of Gallium-Indium-Zinc-Oxide Thin Film Transistors for Three-Dimensional Stacking Memory", *IEEE Electron Device Letters* , 2008, vol. 29, Issues 6, pp. 549-552.

* cited by examiner

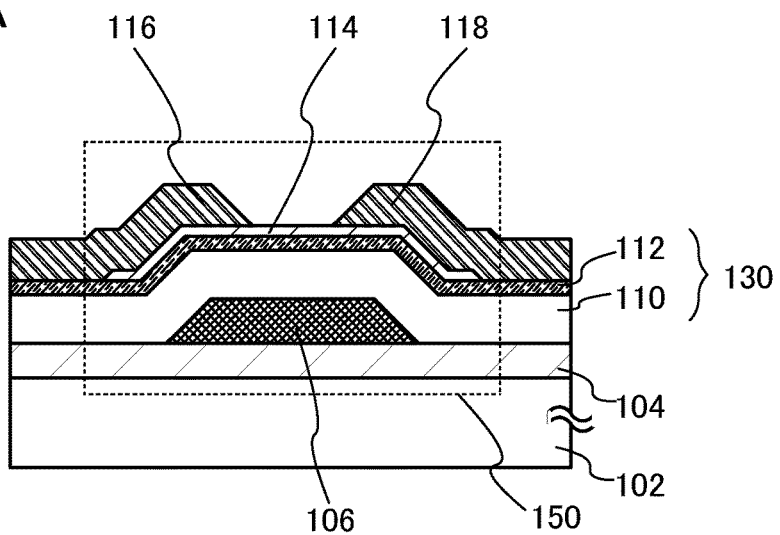
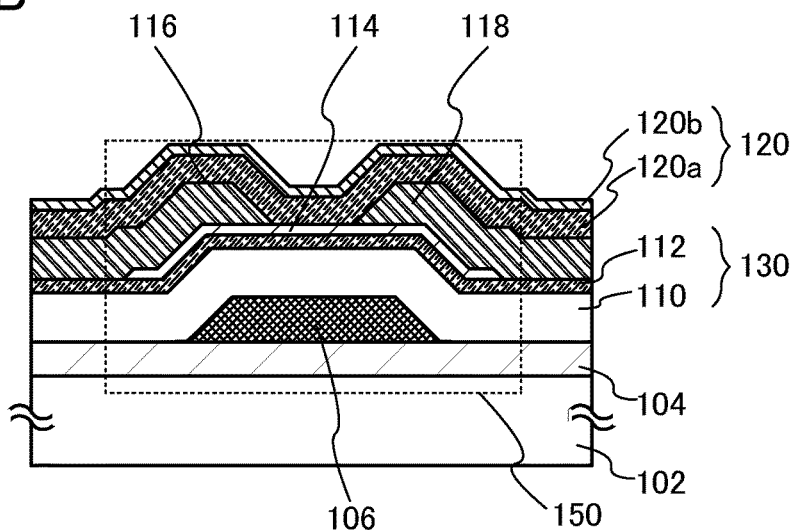
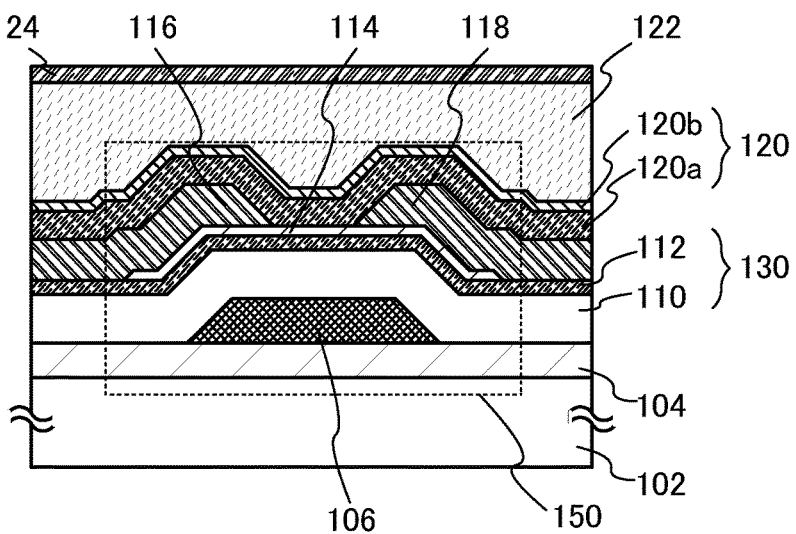

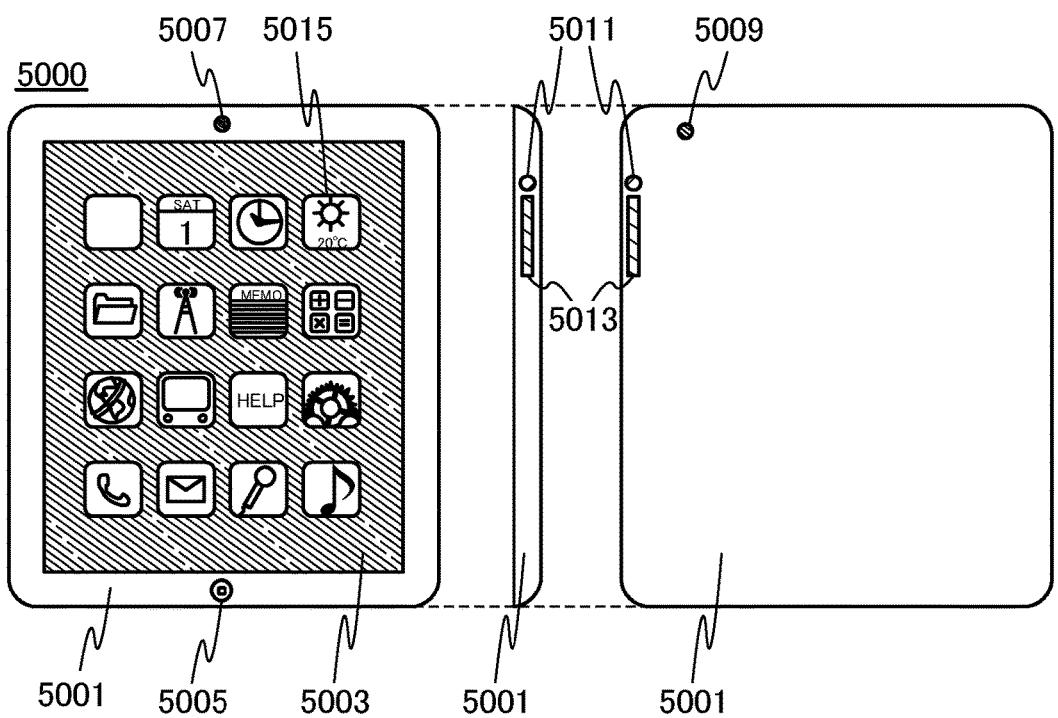
FIG. 9A1  FIG. 9A2  FIG. 9A3
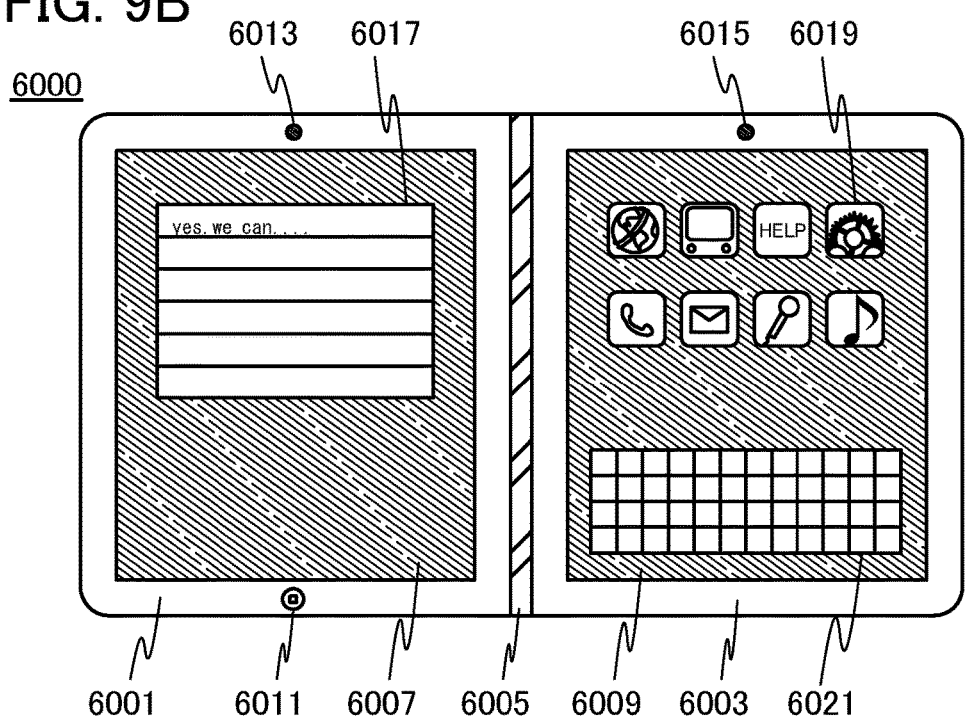
FIG. 9B

OXIDE SEMICONDUCTOR THIN FILM TRANSISTOR INCLUDING OXYGEN RELEASE LAYER

BACKGROUND OF THE INVENTION

1. Field of the Invention

The present invention relates to a semiconductor device and a method for manufacturing the semiconductor device.

In this specification, a semiconductor device generally means a device which can function by utilizing semiconductor characteristics, and an electrooptic device, a semiconductor circuit, and electronic equipment are all semiconductor devices.

2. Description of the Related Art

A technique by which transistors are formed using semiconductor thin films formed over a substrate having an insulating surface has been attracting attention. The transistor is applied to a wide range of electronic devices such as an integrated circuit (IC) or an image, display device (display device). A silicon-based semiconductor material is widely known as a material for a semiconductor thin film applicable to a transistor. As another material, an oxide semiconductor has been attracting attention.

For example, a transistor whose semiconductor thin film includes an amorphous oxide containing indium (In), gallium (Ga), and zinc (Zn) and having an electron carrier concentration of less than $10^{18}/cm^3$ is disclosed (see Patent Document 1, for example).

In addition, the transistor including an oxide semiconductor can operate at higher speed than a transistor including amorphous silicon and can be manufactured more easily than a transistor including polycrystalline silicon; however, a transistor including an oxide semiconductor is known to have a problem of low reliability because of high possibility of fluctuation in electrical characteristics.

For example, in an oxide semiconductor element having a top-gate structure and using ZnO as a main component, when silicon nitride ($SiN_x$) formed by a plasma chemical vapor deposition method (a PE-CVD method) is used as a gate insulating film included in an oxide semiconductor film, reductive elimination of ZnO occurs because hydrogen concentration in the silicon nitride film is high, and thus the resistance of the ZnO layer is lowered. Against the problem, reducing hydrogen concentration in the gate insulating film on the side in contact with the interface with the oxide semiconductor film and using a gate insulating film having a two-layered structure including two films with different hydrogen concentrations are disclosed (see Patent Document 2).

REFERENCE

[Patent Document 1] Japanese Published Patent Application No. 2006-165528

[Patent Document 2] Japanese Published Patent Application No. 2007-073562

SUMMARY OF THE INVENTION

However, it is not enough to reduce hydrogen concentration of the gate insulating film on the side in contact with the interface with the oxide semiconductor film because when oxygen deficiency in the oxide semiconductor film are combined with hydrogen or the like which remains in the gate insulating film, electrons (carriers) are generated in the film. Thus, a threshold voltage of the transistor is shifted in the negative direction and the transistor becomes a normally-off transistor. Hydrogen or the like which remains in the gate insulating film changes the electrical characteristics of the transistor including the oxide semiconductor film, which leads to a reduction in reliability of the semiconductor device.

In view of the above problem, an object of an embodiment of the present invention is to provide a semiconductor device formed using an oxide semiconductor and having stable electrical characteristics. Specifically, an object of an embodiment of the present invention is to provide a semiconductor device including an oxide semiconductor and including a gate insulating film with favorable characteristics. Alternatively, it is another object of an embodiment of the present invention to provide a method for manufacturing the semiconductor device.

A semiconductor device in which an oxide semiconductor film is used for a channel formation region includes a gate insulating film including an oxygen release type oxide film. Oxygen can be supplied to the oxide semiconductor film from the oxygen release type oxide film. Thus, occurrence of oxygen defects in the oxide semiconductor layer can be suppressed, so that the oxide semiconductor film with stable electric characteristics can be provided.

Note that in this specification, "oxygen release type oxide film" means an oxide film from which oxygen is released by heating and is hereinafter referred to as just an "oxygen release type oxide film". The amount of oxygen released from the oxygen release type oxide film can be measured by thermal desorption spectroscopy (TDS).

When a gate insulating film is formed with only the oxygen release type oxide film, it is difficult to satisfy performance capabilities required of the gate insulating film. For example, when the gate insulating film is formed with only the oxygen release type oxide film, it is difficult to satisfy a dielectric strength voltage or coverage. For this reason, a silicon oxynitride film is provided on the lower side of the oxygen release type oxide film. The silicon oxynitride film can be formed under conventional process conditions, by a conventional formation apparatus, or the like which is employed when a silicon-based semiconductor material is used; thus, the silicon oxynitride film is preferable.

Thus, the gate insulating film has a stacked-layer structure of the silicon oxynitride film and the oxygen release type oxide film. With the silicon oxynitride film, a dielectric insulating voltage and coverage can be improved. With the oxygen release type oxide film, oxygen can be supplied to the oxide semiconductor film. The hydrogen concentration of the oxygen release type oxide film can be lower than that in the silicon oxynitride film. With such a structure, an excellent gate insulating film can be provided. Thus, a semiconductor device with stable electric characteristics can be provided. Details thereof are described below.

One embodiment of the present invention is a semiconductor device including a gate electrode, a gate insulating film over the gate electrode, an oxide semiconductor film over the gate insulating film, and a source electrode and a drain electrode in contact with the oxide semiconductor film. The gate insulating film includes at least a silicon oxynitride film and an oxygen release type oxide film which is formed over the silicon oxynitride film. The oxide semiconductor film is formed on and in contact with the oxygen release type oxide film.

When the silicon oxynitride film, the oxygen release type oxide film, and the oxide semiconductor film are formed in this order, each interface can have favorable characteristics.

With such a layered structure, hydrogen concentration of the gate insulating film is gradually reduced toward the oxide semiconductor film side. Further, since the oxygen release type oxide film is in contact with the oxide semiconductor film, oxygen can be supplied to the oxide semiconductor film. Thus, the gate insulating film with high quality in that a threshold voltage is low, an insulating property is high, and oxygen can be supplied to the oxide semiconductor film can be formed.

In addition, the silicon oxynitride can be formed under conventional process conditions, by a conventional formation apparatus, or the like which is employed when a silicon-based semiconductor material is used; thus, the silicon oxynitride film is preferable.

One embodiment of the present invention is a semiconductor device including a gate electrode, a gate insulating film over the gate electrode, an oxide semiconductor film over the gate insulating film, a source electrode and a drain electrode in contact with the oxide semiconductor film, and an inorganic insulating film over the oxide semiconductor film, the source electrode, and the drain electrode. The gate insulating film includes at least a silicon oxynitride film and an oxygen release type oxide film which is formed over the silicon oxynitride film. The oxide semiconductor film is formed on and in contact with the oxygen release type oxide film.

When the inorganic insulating film is formed over the oxide semiconductor film, entry of impurities (such as water and hydrogen) into the oxide semiconductor film can be suppressed.

One embodiment of the present invention is a semiconductor device including a gate electrode, a gate insulating film over the gate electrode, an oxide semiconductor film over the gate insulating film, a source electrode and a drain electrode in contact with the oxide semiconductor film, an inorganic insulating film over the oxide semiconductor film, the source electrode, and the drain electrode, an organic insulating film over the inorganic insulating film, and a conductive film over the organic insulating film. The gate insulating film includes at least a silicon oxynitride film and an oxygen release type oxide film which is formed over the silicon oxynitride film. The oxide semiconductor film is formed on and in contact with the oxygen release type oxide film.

Owing to the conductive film formed over the organic insulating film, charge such as an electrostatic discharge can be diffused.

In addition, the conductive film may be electrically connected to the source electrode or the drain electrode through the inorganic insulating film and the organic insulating film. The conductive film may be formed in a region overlapping with the oxide semiconductor film. Owing to such a structure, a potential on the side of a backchannel of the oxide semiconductor film can be adjusted to control a threshold voltage.

Another embodiment of the present invention is a method for manufacturing a semiconductor device in which a gate electrode is formed over a glass substrate, a silicon oxynitride film is formed over the gate electrode, heat treatment is performed after the silicon oxynitride film is formed, an oxygen release type oxide film is formed over the silicon oxynitride film, an oxide semiconductor film is formed over the oxygen release type oxide film, and a source electrode and a drain electrode are formed over the oxide semiconductor film, and in which the oxygen release type oxide film and the oxide semiconductor film are successively formed in a vacuum.

When the oxygen release type oxide film and the oxide semiconductor film are successively formed in a vacuum, entry of impurities such as water and hydrogen into the interface between the oxygen release type oxide film and the oxide semiconductor film can be suppressed.

Another embodiment of the present invention is a method for manufacturing a semiconductor device in which a gate electrode is formed over a glass substrate, a silicon oxynitride film is formed over the gate electrode, heat treatment is performed after the silicon oxynitride film is formed, an oxygen release type oxide film is formed over the silicon oxynitride film, an oxide semiconductor film is formed over the oxygen release type oxide film, and a source electrode and a drain electrode are formed over the oxide semiconductor film, an inorganic insulating film is formed after the source electrode and the drain electrode are formed, an organic insulating film is formed after the inorganic insulating film is formed, and heat treatment is performed after the organic insulating film, and in which the oxygen release type oxide film and the oxide semiconductor film are successively formed in a vacuum.

Another embodiment of the present invention is a method for manufacturing a semiconductor device in which a gate electrode is formed over a glass substrate, a silicon oxynitride film is formed over the gate electrode, heat treatment is performed after the silicon oxynitride film is formed, an oxygen release type oxide film is formed over the silicon oxynitride film, an oxide semiconductor film is formed over the oxygen release type oxide film, and a source electrode and a drain electrode are formed over the oxide semiconductor film, an inorganic insulating film is formed after the source electrode and the drain electrode are formed, an organic insulating film is formed after the inorganic insulating film is formed, heat treatment is performed after the organic insulating film is formed, and a conductive film is formed over the organic insulating film, and in which the oxygen release type oxide film and the oxide semiconductor film are successively formed in a vacuum.

Another embodiment of the present invention is a method for manufacturing a semiconductor device in which a gate electrode is formed over a glass substrate, a silicon oxynitride film is formed over the gate electrode, heat treatment is performed after the silicon oxynitride film is formed, an oxygen release type oxide film is formed over the silicon oxynitride film, an oxide semiconductor film is formed over the oxygen release type oxide film, and a source electrode and a drain electrode are formed over the oxide semiconductor film, an inorganic insulating film is formed after the source electrode and the drain electrode are formed, an organic insulating film is formed after the inorganic insulating film is formed, heat treatment is performed after the organic insulating film is formed, an opening portion reaching the source electrode or the drain electrode is formed over the inorganic insulating film and the organic insulating film, and a conductive film is formed over the organic insulating film and the opening portion, and in which the oxygen release type oxide film and the oxide semiconductor film are successively formed in a vacuum.

In each of the above structures, it is preferable that the inorganic insulating film include at least the oxygen release type oxide film and a metal oxide film formed over the oxygen release type oxide film and that the metal oxide film be an aluminum oxide film with film density of higher than or equal to 3.2 g/cm$^3$.

When the metal oxide film is an aluminum oxide film with this film density, oxygen release from the oxygen release type oxide film can be suppressed and oxygen is preferably supplied to the oxide semiconductor film. When oxygen is supplied to the oxide semiconductor film, occurrence of oxygen deficiency in the oxide semiconductor film can be suppressed.

Further, in each of the above structures, it is preferable that the amount of oxygen released from the oxygen release type oxide film which is converted to oxygen atoms be greater than or equal to $1.0 \times 10^{18}$ atoms/cm$^3$, preferably greater than or equal to $1.0 \times 10^{19}$ atoms/cm$^3$, further preferably greater than or equal to $1.0 \times 10^{20}$ atoms/cm$^3$ in thermal desorption spectroscopy (TDS).

When the amount of oxygen released from the oxygen release type oxide film is in the above range, oxygen can be preferably supplied to the oxide semiconductor film. When oxygen is supplied to the oxide semiconductor film, occurrence of oxygen deficiency in the oxide semiconductor film can be suppressed.

In addition, in each of the above structures, it is preferable that the oxygen release type oxide film be a silicon oxide film. The silicon oxide film can be formed by a sputtering method, for example.

In each of the above structures, it is preferable that the oxide semiconductor film include at least one of oxides of the followings: indium, zinc, gallium, zirconium, tin, gadolinium, titanium, and cerium. In particular, an oxide including indium or zinc is preferable.

In each of the above structures, it is preferable that the gate electrode include at least one of the followings: molybdenum, titanium, tantalum, tungsten, aluminum, copper, neodymium, and scandium. In particular, copper is preferable because resistance of the gate electrode can be reduced. Further, tungsten, titanium, and the like which are high-melting point metals are preferable because heat resistance of the gate electrode can be improved.

In each of the above structures, heat treatment is performed in a nitrogen atmosphere, an oxygen atmosphere, or a vacuum and is preferably performed at a temperature higher than or equal to 200° C. and lower than or equal to 450° C., further preferably higher than or equal to 200° C. and lower than or equal to 400° C. Note that in this specification and the like, a "vacuum" means a state where a pressure is lower than an atmospheric pressure, for example, lower than or equal to $1.0 \times 10^{-1}$ Pa.

A semiconductor device including an oxide semiconductor and having stable electric characteristics can be provided. A semiconductor device including an oxide semiconductor and an excellent gate insulating film can be provided. Further, a method for manufacturing the semiconductor device can be provided.

BRIEF DESCRIPTION OF THE DRAWINGS

FIGS. 1A to 1C are diagrams illustrating cross-sections of embodiments of a semiconductor device.

FIGS. 9A1, 9A2, 9A3, and 9B are diagrams illustrating electronic devices.

DETAILED DESCRIPTION OF THE INVENTION

Figure 2A:
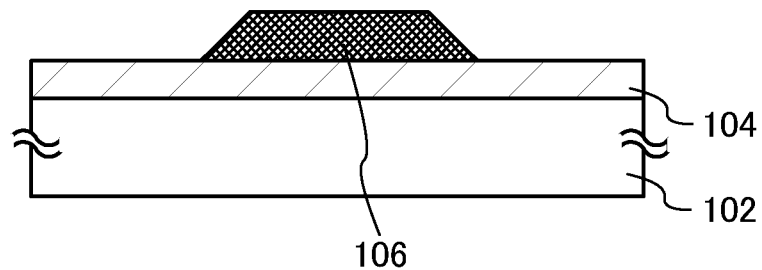
FIGS. 2A to 2C are diagrams illustrating an embodiment of a method for manufacturing a semiconductor device.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Further, in the embodiments hereinafter described, the same parts are denoted with the same reference numerals throughout the drawings. The thickness, width, relative relation of position, and the like of elements illustrated in the drawings are exaggerated for clarification of description of the embodiments in some cases.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

In addition, in this specification and the like, a silicon nitride oxide film refers to a film which contains nitrogen, oxygen, and silicon as components and in which nitrogen content is larger than oxygen content. In addition, a silicon oxynitride film refers to a film which contains oxygen, nitrogen, and silicon as components and in which oxygen content is larger than nitrogen content. A silicon oxide film refers to a film containing oxygen and silicon as components.

For example, a silicon nitride oxide film refers to a film containing oxygen in the range of from 5 at. % to 30 at. % inclusive, nitrogen in the range of from 20 at. % to 55 at. % inclusive, silicon in the range of from 25 at. % to 35 at. % inclusive, and hydrogen in the range of from 10 at. % to 25 at. % inclusive. A silicon oxynitride film refers to a film containing oxygen in the range of from 50 at. % to 70 at. % inclusive, nitrogen in the range of from 0.5 at. % to 15 at. % inclusive, silicon in the range of from 25 at. % to 35 at. % inclusive, and hydrogen in the range of from 0 at. % to 10 at. % inclusive. A silicon oxide film refers to a film containing oxygen in the range of from 50 at. % to 70 at. % inclusive, nitrogen in the range of from 0 at. % to 0.5 at. % inclusive, silicon in the range of from 25 at. % to 35 at. % inclusive, hydrogen in the range of from 0 at. % to 5 at. % inclusive, and argon in the range of from 0 at. % to 5 at. % inclusive.

Note that the above ranges are ranges for cases where measurement is performed using Rutherford backscattering spectrometry (RBS) and hydrogen forward scattering spectrometry (HFS). In addition, the total of the percentages of the constituent elements does not exceed 100 atomic %.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Embodiment 1

In this embodiment, a mode of a semiconductor device according to the present invention is described with reference to FIGS. 1A to 1C. FIGS. 1A to 1C each show a cross-sectional view of a semiconductor device including an oxide semiconductor film.

A semiconductor device in FIG. 1A includes a substrate 102, a base insulating film 104 over the substrate 102, a gate electrode 106 over the base insulating film 104, a silicon oxynitride film 110 over the base insulating film 104 and the gate electrode 106, an oxygen release type oxide film 112 and which is formed over the silicon oxynitride film 110, an oxide semiconductor film 114 over the oxygen release type oxide film 112, a source electrode 116 over the oxygen release type oxide film 112 and the oxide semiconductor film 114, and a drain electrode 118 over the oxygen release type oxide film 112 and the oxide semiconductor film 114.

In the semiconductor device in FIG. 1A, a gate insulating film 130 includes the silicon oxynitride film 110 and the oxygen release type oxide film 112, and a transistor 150 includes the substrate 102, the base insulating film 104, the gate electrode 106, the gate insulating film 130, the oxide semiconductor film 114, the source electrode 116, and the drain electrode 118.

Note that the silicon oxynitride film 110 used for the gate insulating film 130 has better coverage at steps and the like than the oxygen release type oxide film 112. That is, the silicon oxynitride film 110 can cover the steps of the gate electrode 106 without disconnection. It is preferable that the silicon oxynitride film 110 is used for the gate insulating film 130 because the silicon oxynitride film 110 has lower defect density than the oxygen release type oxide film 112 and can be formed under conventional process conditions, by a conventional formation apparatus, or the like which is employed when a silicon-based semiconductor material is used.

The oxygen release type oxide film 112 used for the gate insulating film 130 has lower hydrogen concentration than the silicon oxynitride film 110. That is, the hydrogen concentration in the gate insulating film 130 on the oxide semiconductor film 114 side is decreased; thus, hydrogen that is an impurity is hardly supplied to the oxide semiconductor film 114, which is preferable. Further, since the oxide semiconductor film 114 is formed over the oxygen release type oxide film 112, oxygen can be supplied to the oxide semiconductor film 114 from the oxygen release type oxide film 112.

The oxygen release type oxide film 112 is formed by a material from which the released amount of oxygen is large. For example, the amount of oxygen released from the oxygen release type oxide film 112 which is converted to oxygen atoms is greater than or equal to $1.0 \times 10^{18}$ atoms/$cm^3$, preferably greater than or equal to $1.0 \times 10^{19}$ atoms/$cm^3$, further preferably greater than or equal to $1.0 \times 10^{20}$ atoms/$cm^3$ in thermal desorption spectroscopy (TDS). As the oxygen release type oxide film 112, for example, a silicon oxide film formed by sputtering can be used. Note that when the amount of oxygen is set in the above range, oxygen is favorably supplied to the oxide semiconductor film 114.

Alternatively, as the oxygen release type oxide film 112, for example, a silicon oxide film containing oxygen higher than a stoichiometric composition ratio, in other words, an oxygen-excess silicon oxide film ($SiO_x$ (x>2)) can be used. The oxygen-excess silicon oxide film ($SiO_x$ (x>2)) is a film of which the number of oxygen atoms per unit volume is more than twice the number of silicon atoms per unit volume. Note that the number of silicon atoms and the number of oxygen atoms per unit volume are the values measured by Rutherford backscattering spectrometry.

As described above, when the gate insulating film 130 includes the oxygen release type oxide film 112 on the side in contact with the oxide semiconductor film 114, oxygen can be favorably supplied to the oxide semiconductor film 114.

The oxide semiconductor film 114 preferably contains at least indium (In) or zinc (Zn). In particular, In and Zn are preferably contained. Note that details of a material and the like that can be used for the oxide semiconductor film 114 are described in Embodiment 2.

In addition, the source electrode 116 and the drain electrode 118 serve as a source electrode and a drain electrode of the transistor 150, respectively. In this embodiment, a stacked film of tungsten, aluminum, and titanium can be used for the source electrode 116 and the drain electrode 118. For example, on the side in contact with the oxide semiconductor film 114, a tungsten film having a high melting point is formed, an aluminum film having a low melting point is formed over the tungsten film, and a titanium film having a high melting point is formed over the aluminum film. In this manner, a material having a low melting point is sandwiched between materials each having a high melting point; thus, the source electrode 116 and the drain electrode 118 can have high heat resistance.

Next, the semiconductor device illustrated in FIG. 1B is described.

The semiconductor device in FIG. 1B has a structure in which the semiconductor device in FIG. 1A further includes an inorganic insulating film. The details are as follows.

A semiconductor device in FIG. 1B includes the substrate 102, the base insulating film 104 over the substrate 102, the gate electrode 106 over the base insulating film 104, the silicon oxynitride film 110 over the base insulating film 104 and the gate electrode 106, the oxygen release type oxide film 112 formed over the silicon oxynitride film 110, the oxide semiconductor film 114 over the oxygen release type oxide film 112, the source electrode 116 over the oxygen release type oxide film 112 and the oxide semiconductor film 114, the drain electrode 118 over the oxygen release type oxide film 112 and the oxide semiconductor film 114, and an inorganic insulating film 120 over the oxide semiconductor film 114, the source electrode 116, and the drain electrode 118.

In the semiconductor device in FIG. 1B, the gate insulating film 130 includes the silicon oxynitride film 110 and the oxygen release type oxide film 112, and the transistor 150 includes the substrate 102, the base insulating film 104, the gate electrode 106, the gate insulating film 130, the oxide semiconductor film 114, the source electrode 116, and the drain electrode 118.

The transistor 150 in FIG. 1B has a structure similar to the structure of FIG. 1A; thus, the description of FIG. 1A can be referred to for the details.

The inorganic insulating film 120 serves as a protective film for the oxide semiconductor film 114. Thus, it is preferable that the inorganic insulating film 120 have a structure by which moisture and hydrogen are prevented from entering the oxide semiconductor film 114. It is further preferable that the inorganic insulating film 120 have a function of supplying oxygen to the oxide semiconductor film 114. In this embodiment, the inorganic insulating film 120 has a stacked structure of an oxygen release type oxide film 120a and a metal oxide film 120b, for example.

The oxygen release type oxide film 120a used for the inorganic insulating film 120 can have a structure similar to the structure of the oxygen release type oxide film 112 used for the gate insulating film 130. For example, the amount of oxygen released from the oxygen release type oxide film 112 which is converted to oxygen atoms is greater than or equal to $1.0 \times 10^{18}$ atoms/cm$^3$, preferably greater than or equal to $1.0 \times 10^{19}$ atoms/cm$^3$, further preferably greater than or equal to $1.0 \times 10^{20}$ atoms/cm$^3$ in thermal desorption spectroscopy (TDS). As the oxygen release type oxide film 120a, for example, a silicon oxide film formed by sputtering can be used. Note that when the amount of oxygen is set in the above range, oxygen is favorably supplied to the oxide semiconductor film 114.

As the metal oxide film 120b used for the inorganic insulating film 120, an aluminum oxide film can be used, for example. The aluminum oxide film preferably has a film density of 3.2 g/cm$^3$ or more, further preferably, 3.6 g/cm$^3$ or more. When the aluminum oxide film is used as the metal oxide film 120b, the inorganic insulating film 120 can have high moisture resistance. Further, the aluminum oxide film has high passivation quality and can suppress oxygen diffusion from the oxygen release type oxide film 120a.

When the inorganic insulating film 120 having such a stacked structure and the gate insulating film 130 are used, oxygen can be favorably supplied to the oxide semiconductor film 114. Specifically, oxygen is supplied to the oxide semiconductor film 114 from the oxygen release type oxide film 112 which is provided on the side in contact with the oxide semiconductor film 114 and which is part of the gate insulating film 130 and from the oxygen release type oxide film 120a which is part of the inorganic insulating film 120. In addition, the inorganic insulating film 120 includes aluminum oxide in the metal oxide film 120b over the oxygen release type oxide film 120a. With the aluminum oxide film, oxygen can be prevented from being diffused to the outside from the oxygen release type oxide film 120a and oxygen can be released to the oxide semiconductor film 114 side, whereby oxygen can be efficiently supplied to the oxide semiconductor film 114.

In other words, the oxide semiconductor film 114 has a structure, when seen from a cross section, by which oxygen is supplied to the oxide semiconductor film 114 from thereover and therebelow.

Next, a semiconductor device illustrated in FIG. 1C is described.

The semiconductor device in FIG. 1C has a structure in which the semiconductor device in FIG. 1B further includes an organic insulating film and a conductive film. The details are as follows.

A semiconductor device in FIG. 1C includes the substrate 102, the base insulating film 104 over the substrate 102, the gate electrode 106 over the base insulating film 104, the silicon oxynitride film 110 over the base insulating film 104 and the gate electrode 106, the oxygen release type oxide film 112 formed over the silicon oxynitride film 110, the oxide semiconductor film 114 over the oxygen release type oxide film 112, the source electrode 116 over the oxygen release type oxide film 112 and the oxide semiconductor film 114, the drain electrode 118 over the oxygen release type oxide film 112 and the oxide semiconductor film 114, the inorganic insulating film 120 over the oxide semiconductor film 114, the source electrode 116, and the drain electrode 118, and an organic insulating film 122 over the inorganic insulating film 120, and a conductive film 124 over the organic insulating film 122.

In the semiconductor device in FIG. 1C, the gate insulating film 130 includes the silicon oxynitride film 110 and the oxygen release type oxide film 112, and the transistor 150 includes the substrate 102, the base insulating film 104, the gate electrode 106, the gate insulating film 130, the oxide semiconductor film 114, the source electrode 116, and the drain electrode 118.

Note that the transistor 150 in FIG. 1C has a structure similar to the structures illustrated in FIGS. 1A and 1B. Further, the inorganic insulating film 120 in FIG. 1C has a structure similar to the structure illustrated in FIG. 1B. The above description can be referred to for descriptions of the transistor 150 and the inorganic insulating film 120 in FIG. 1C.

With the organic insulating film 122, the surface of the transistor 150 can be flat. Further, the organic insulating film 122 can be formed thicker than inorganic insulating film 120, and for example, can be formed using an organic resin such as an acrylic resin and a polyimide resin by a spin coating method.

For the conductive film 124, a conductive material with a light-transmitting property, for example, indium tin oxide (ITO), indium tin oxide containing silicon or silicon oxide, indium zinc oxide, graphene, or the like can be used.

Note that the material of the conductive film 124 is not limited to the above. For example, a metal film (a film of aluminum, titanium, or the like) may be used. Such a metal film is preferably used because the transistor 150 can be shielded from light.

The conductive film 124 can be provided to overlap with the oxide semiconductor film 114. With such a structure, in a cross section, a potential on an upper side of the oxide semiconductor film 114 (i.e., a back-channel side) can be controlled. The potential of the conductive film may be in a floating state, the same as GND, the same as that of the gate electrode 106, or the same as those of the source electrode 116 and the drain electrode 118.

The conductive film 124 also has a function of shielding the transistor 150 from static charges (a so-called electrostatic discharge: ESD). With the conductive film 124 over the transistor 150, charge due to electrostatic discharge (ESD) or the like can be dissipated.

As described above, a gate insulating film including a silicon oxynitride film and an oxygen release type oxide film is formed in a semiconductor device including the oxide semiconductor film of this embodiment. Owing to the silicon oxynitride film, the gate insulating film can have high coverage, a high insulating property, and low defect density. Further, with the oxygen release type oxide film, oxygen can be supplied to the oxide semiconductor film. Thus, a semiconductor device with stable electric characteristics can be provided.

This embodiment can be combined with any of the other embodiments as appropriate.

Embodiment 2

In this embodiment, methods for manufacturing the semiconductor devices in FIGS. 1A to 1C in Embodiment 1 are described with reference to FIGS. 2A to 2C, FIGS. 3A to 3C, and FIGS. 4A and 4B. Note that portions similar to those in FIGS. 1A to 1C are denoted by the same reference numerals, and description thereof is skipped.

First, the base insulating film 104 is formed over the substrate 102. Then, the gate electrode 106 is formed over the base insulating film 104 (see FIG. 2A).

As the substrate 102, a substrate of a glass material such as aluminosilicate glass, aluminoborosilicate glass, or barium borosilicate glass is used. In the mass production, a mother glass with the following size is preferably used for the substrate 102: the 8-th generation (2160 mm×2460 mm); the 9-th generation (2400 mm×2800 mm, or 2450 mm×3050 mm); the 10-th generation (2950 mm×3400 mm); or the like. High process temperature and a long period of process time drastically shrink the mother glass. Thus, in the case where mass production is performed with the use of the mother glass, it is preferable that the heat process in the manufacturing process be preferably performed at a temperature lower than or equal to 600° C., further preferably lower than or equal to 450° C., still further preferably lower than or equal to 350° C.

The base insulating film 104 is formed by a PE-CVD method or a sputtering method to have a thickness greater than or equal to 50 nm and less than or equal to 600 nm with the use of one of a silicon oxide film, a gallium oxide film, an aluminum oxide film, a silicon nitride film, a silicon oxynitride film, an aluminum oxynitride film, and a silicon nitride oxide film or a stacked layer including any of these films. The base insulating film 104 can suppress the entry of impurities from the substrate 102 side. Note that in the case where the amount of moisture and the like adsorbed on the surface of the substrate 102 and contained in the substrate 102 is small, for example, the base insulating film 104 is not necessarily provided.

Next, after a conductive film is formed over the base insulating film 104, the gate electrode 106 is formed through a photolithography step and an etching step (see FIG. 2A). The gate electrode 106 can be formed by a sputtering method or the like to have a single-layer structure or a stacked-layer structure using a metal material such as molybdenum, titanium, tantalum, tungsten, aluminum, copper, neodymium, or scandium, or an alloy material containing any of these materials.

Figure 2B:
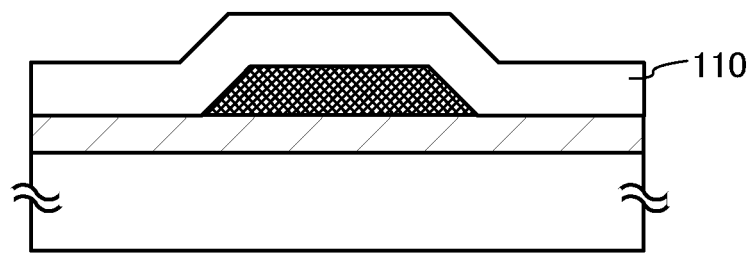

Next, the silicon oxynitride film 110 is formed over the base insulating film 104 and the gate electrode 106 (see FIG. 2B).

The silicon oxynitride film 110 can be formed by a PE-CVD apparatus. The silicon oxynitride film 110 can be formed using a gas such as $SiH_4$, $N_2O$, $NH_3$, or $O_2$, for example. The thickness of the silicon oxynitride film 110 can be greater than or equal to 50 nm and less than or equal to 400 nm (preferably greater than or equal to 100 nm and less than or equal to 300 nm).

Next, heat treatment is performed on the substrate 102 over which the silicon oxynitride film 110 is formed.

Note that for the heat treatment, an electric furnace or a device for heating an object by heat conduction or heat radiation from a heating element such as a resistance heating element can be used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used. Alternatively, oxygen may be used as another high-temperature gas. When oxygen is used, oxygen detachment from the silicon oxynitride film 110 can be suppressed or oxygen supply to the silicon oxynitride film 110 can be performed.

In the case where the mother glass is used as the substrate 102, a high process temperature and a long period of process time drastically shrink the mother glass. Thus, the preferable heating temperature higher than or equal to 200° C. and lower than or equal to 450° C., further preferably higher than or equal to 250° C. and lower than or equal to 350° C.

Through the heat treatment, impurities such as hydrogen and water in the silicon oxynitride film 110 can be removed. Further, through the heat treatment, defect density in the silicon oxynitride film 110 can be reduced. Since the silicon oxynitride film 110 serves as part of the gate insulating film, reliability of the semiconductor device can be improved by reducing impurities or defect density in the silicon oxynitride film 110. For example, the heat treatment can suppress deterioration of the semiconductor device due to a negative bias stress test with light irradiation, which is one of reliability tests of semiconductor devices.

The heat treatment may be performed as pretreatment for deposition of the oxygen release type oxide film 112 formed later. For example, the oxygen release type oxide film 112 and the oxide semiconductor film 113 may be formed after the silicon oxynitride film 110 is formed and heat treatment is performed in a preheating chamber of a sputtering apparatus (i.e., in a vacuum).

Further, the heat treatment may be performed more than once. For example, the oxygen release type oxide film 112 and the oxide semiconductor film 113 may be formed after the silicon oxynitride film 110 is formed, heat treatment is performed in a nitrogen atmosphere using an electric furnace, and heat treatment is performed in a preheating chamber of a sputtering apparatus (i.e., in a vacuum).

Figure 2C:
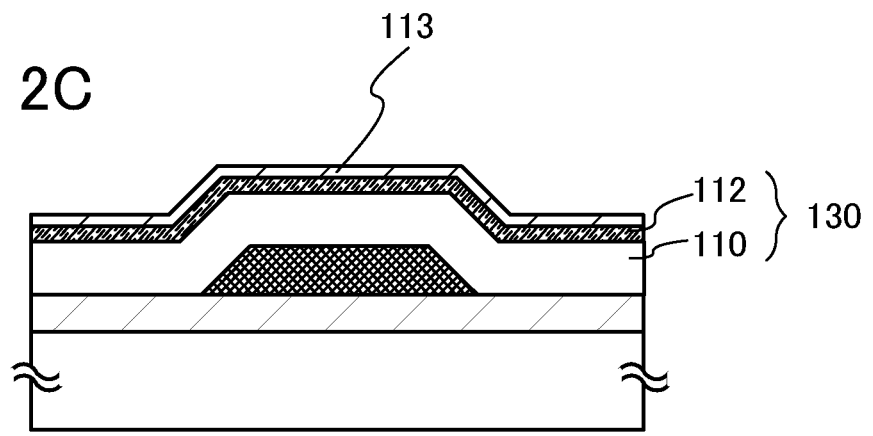

Next, the oxygen release type oxide film 112 is formed over the silicon oxynitride film 110, and then, the oxide semiconductor film 113 is formed thereover (see FIG. 2C). Note that the gate insulating film 130 is formed with the silicon oxynitride film 110 and the oxygen release type oxide film 112.

The oxygen release type oxide film 112 and the oxide semiconductor film 113 can be successively formed in a vacuum using a multi-chamber sputtering apparatus. When the oxygen release type oxide film 112 and the oxide semiconductor film 113 are successively formed in a vacuum, the interface between the oxygen release type oxide film 112 and the oxide semiconductor film 113 can be kept clean.

Note that when heat treatment is performed before the oxygen release type oxide film 112 is formed, the heat treatment, the deposition of the oxygen release type oxide film 112, and the deposition of the oxide semiconductor film 113 can be successively performed in a vacuum using a sputtering apparatus with a multi-chamber structure.

The oxygen release type oxide film 112 can be formed using a Si target by a sputtering method in a mixed atmosphere of an inert gas and an oxygen gas or an oxygen gas atmosphere, for example. The thickness of the oxygen release type oxide film 112 can be greater than or equal to 10 nm and less than or equal to 150 nm (preferably greater than or equal to 20 nm and less than or equal to 100 nm).

Examples of a sputtering method include an RF sputtering method in which a high-frequency power source is used as a sputtering power source, a DC sputtering method in which a direct current source is used, an AC sputtering method using an AC power source, and the like. In addition, there is a pulsed DC sputtering method in which a bias is applied in a pulsed manner. It is preferable to use an RF sputtering method or an AC sputtering method because the oxygen release type oxide film 112 can be dense.

It is preferable that, in the process for forming the oxygen release type oxide film 112 and the oxide semiconductor film 113, the substrate 102 over which the silicon oxynitride film 110 is formed is subjected to heat treatment in a preheating chamber of a sputtering apparatus (i.e., in a vacuum) as a pretreatment for the oxygen release type oxide film 112, and impurities such as hydrogen and moisture adsorbed on the substrate 102 and the silicon oxynitride film 110 are eliminated and exhausted. As an exhaustion unit provided in the preheating chamber, a cryopump is preferable.

The oxygen release type oxide film 112 is formed by a material from which the released amount of oxygen is large. For example, the amount of oxygen released from the oxygen release type oxide film 112 which is converted to oxygen atoms is greater than or equal to $1.0 \times 10^{18}$ atoms/cm$^3$, preferably greater than or equal to $1.0 \times 10^{19}$ atoms/cm$^3$, further preferably greater than or equal to $1.0 \times 10^{20}$ atoms/cm$^3$ in thermal desorption spectroscopy (TDS). As the oxygen release type oxide film 112, for example, a silicon oxide film formed by sputtering can be used. Note that when the amount of oxygen is set in the above range, oxygen is favorably supplied to the oxide semiconductor film 113.

Alternatively, as the oxygen release type oxide film 112, for example, an oxygen-excess silicon oxide film ($SiO_x$ (x>2)) can be used. The oxygen-excess silicon oxide film is a film of which the number of oxygen atoms per unit volume is more than twice the number of silicon atoms per unit volume. Note that the number of silicon atoms and the number of oxygen atoms per unit volume are the values measured by Rutherford backscattering spectrometry.

It is preferable that the oxygen release type oxide film 112 be formed by a sputtering method. The oxygen release type oxide film 112 formed by a sputtering method can release a larger amount of oxygen than a film formed by a PE-CVD method.

For the oxide semiconductor film 113, an oxide preferably contains at least indium (In) or zinc (Zn). In particular, In and Zn are preferably contained. In addition, as a stabilizer for reducing the variation in electrical characteristics of a transistor using the oxide, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Titanium (Ti) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For the oxide semiconductor film 113, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide (also referred to as ITZO), a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than the In, Ga, and Zn.

For the oxide semiconductor film 113, a material expressed as the chemical formula $InMO_3(ZnO)_m$ (m>0, m is not an integer) may be used. Note that M represents one or more metal elements selected from Ga, Fe, Mn, and Co. Alternatively, as the oxide semiconductor, a material expressed by a chemical formula, $In_2SnO_5(ZnO)_n$ (n>0, n is a natural number) may be used.

For example, an In—Ga—Zn-based oxide with an atomic ratio of In:Ga:Zn 1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, without limitation to the materials given above, a material with an appropriate composition may be used depending on necessary semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, high mobility can be obtained relatively easily in the case of using an In—Sn—Zn-based oxide. However, the mobility can be increased by reducing the defect density in the bulk also in the case of using the In—Ga—Zn-based oxide.

For example, in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \leq r^2$, and r may be 0.05, for example. The same applies to other oxides.

The oxide semiconductor film 113 may be either single crystal or non-single-crystal. In the latter case, the oxide semiconductor may be either amorphous or polycrystal. Further, the oxide semiconductor may have either an amorphous structure including a portion having crystallinity or a non-amorphous structure.

It is relatively easy to make a surface of an amorphous oxide semiconductor film flat. Thus, when a transistor is manufactured with the use of the oxide semiconductor, interface scattering can be reduced, and relatively high mobility can be obtained relatively easily.

In the crystalline oxide semiconductor film including a crystalline oxide semiconductor, defects in the bulk can be further reduced, and mobility higher than that of an amorphous oxide semiconductor film can be obtained when a surface flatness is improved. In order to improve the surface flatness, the oxide semiconductor film is preferably formed on a flat surface. Specifically, the oxide semiconductor film is preferably formed on a surface with an average surface roughness (Ra) of less than or equal to 1 nm, preferably less than or equal to 0.3 nm, more preferably less than or equal to 0.1 nm.

An oxide semiconductor film including a crystal and having crystallinity (crystalline oxide semiconductor film) can be used as the oxide semiconductor film 113. The crystals in the crystalline oxide semiconductor film may have crystal axes oriented in random directions or in a certain direction.

For example, as the crystalline oxide semiconductor film, a c-axis aligned crystalline oxide semiconductor (CAAC-OS) film can be used.

The CAAC-OS film is not completely single crystal nor completely amorphous. The CAAC-OS film is an oxide semiconductor layer with a crystal-amorphous mixed phase structure where crystalline portions are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film cannot be found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

There are three methods for obtaining a CAAC-OS film when the CAAC-OS film is used as the oxide semiconductor film 113. The first method is to form an oxide semiconductor layer at a film formation temperature higher than or equal to 100° C. and lower than or equal to 450° C., more preferably higher than or equal to 150° C. and lower than or equal to 400° C., thereby obtaining c-axis alignment substantially perpendicular to a surface. The second method is to form a thin oxide semiconductor film and then subject the film to heat treatment performed at a temperature higher than or equal to 200° C. and lower than or equal to 700° C., thereby obtaining c-axis alignment substantially perpendicular to a surface. The third method is to form a first thin oxide semiconductor film, subject the film to heat treatment performed at a temperature higher than or equal to 200° C. and lower than or equal to 700° C., and then form a second oxide semiconductor film, thereby obtaining c-axis alignment substantially perpendicular to a surface.

Note that when a crystalline (single-crystal or microcrystalline) oxide semiconductor film other than a CAAC-OS film is formed as the oxide semiconductor film 113, the formation temperature is not particularly limited.

The energy gap of the oxide semiconductor film 113 is 2.8 eV to 3.2 eV, which is larger than that of silicon, 1.1 eV. Further, the intrinsic carrier density of the oxide semiconductor film 113 is $10^{-9}/cm^3$, which is extremely smaller than that of silicon, $10^{11}/cm^3$.

Majority carriers (electrons) of the oxide semiconductor film 113 flow only from a source of a transistor. Further, a channel formation region of the oxide semiconductor film 113 can be completely depleted, whereby an off-state current of the transistor can be extremely small. The off-state current of the transistor including the oxide semiconductor film 113 is 10 yA/μm or lower at room temperature and is 1 zA/μm or lower at 85° C. to 95° C., which is preferably small.

In the present invention, the oxygen release type oxide film 112 is provided as a base film of the oxide semiconductor film 113. When oxygen is supplied from the oxygen release type oxide film 112, occurrence of oxygen deficiency is suppressed; thus, crystallinity of the oxide semiconductor film 113 can be improved.

The oxide semiconductor film 113 has a thickness greater than or equal to 1 nm and less than or equal to 200 nm (preferably greater than or equal to 15 nm and less than or equal to 30 nm) and can be formed by a sputtering method, a molecular beam epitaxy (MBE) method, a CVD method, a pulse laser deposition method, an atomic layer deposition (ALD) method, or the like as appropriate. The oxide semiconductor film 113 may be formed using a sputtering apparatus which performs film formation with surfaces of a plurality of substrates set substantially perpendicular to a surface of a sputtering target.

Note that it is preferable that the oxide semiconductor film 113 be formed under a condition that much oxygen is contained during film formation (e.g., deposited by a sputtering method in a 100% oxygen atmosphere), so that a film containing much oxygen (preferably including a region where the oxygen content is higher than that in the stoichiometric composition of the oxide semiconductor film 113 in a crystalline state) is formed.

As a target for forming the oxide semiconductor film 113 by a sputtering method, for example, a metal oxide target having a composition ratio of $In_2O_3:Ga_2O_3:ZnO=1:1:2$ [molar ratio] is used to form an In—Ga—Zn film. Without limitation to the material and the composition of the above target, for example, a metal oxide target having a composition ratio of $In_2O_3:Ga_2O_3:ZnO=1:1:1$ [molar ratio] may be used.

Further, when the oxide semiconductor film 113 is formed using the above metal oxide target, the composition of the target is different from the composition of a film formed over the substrate in some cases. For example, when the metal oxide target having a molar ratio of $In_2O_3:Ga_2O_3:ZnO=1:1:1$ is used, the composition ratio of the thin oxide semiconductor film 113 becomes $In_2O_3:Ga_2O_3:ZnO=1:1:0.6$ to $1:1:0.8$ [molar ratio] in some cases, though it depends on the film formation conditions. This is because in formation of the oxide semiconductor film 113, ZnO is sublimed, or because a sputtering rate differs between the components of $In_2O_3$, $Ga_2O_3$, and ZnO.

Accordingly, when a thin film having a preferable composition ratio is formed, a composition ratio of the metal oxide target needs to be adjusted in advance. For example, in order to make the composition ratio of the thin oxide semiconductor film 113 be $In_2O_3:Ga_2O_3:ZnO=1:1:1$ [molar ratio], the composition ratio of the metal oxide target is made to be $In_2O_3:Ga_2O_3:ZnO=1:1:1.5$ [molar ratio]. In other words, the ZnO content of the metal oxide target is made higher in advance. The composition ratio of the target is not limited to the above value, and can be adjusted as appropriate depending on the film formation conditions or the composition of the thin film to be formed. Further, it is preferable to increase the ZnO content of the metal oxide target because in that case, the crystallinity of the obtained thin film is improved.

The filling factor of the metal oxide target is greater than or equal to 90% and less than or equal to 100%, preferably greater than or equal to 95% and less than or equal to 99.9%. With the use of the metal oxide target with high fill rate, a dense oxide semiconductor film 113 can be formed.

It is preferable that a high-purity gas in which an impurity such as hydrogen, water, a hydroxyl group, or hydride is reduced be used as the sputtering gas for the formation of the oxide semiconductor film 113.

In order to remove moisture remaining in a deposition chamber of a sputtering apparatus, an entrapment vacuum pump, for example, a cryopump, an ion pump, or a titanium sublimation pump is preferably used. As an exhaustion unit, a turbo molecular pump to which a cold trap is added may be used. In the deposition chamber which is evacuated with the cryopump, a hydrogen atom, a compound containing a hydrogen atom, such as water ($H_2O$), (more preferably, also a compound containing a carbon atom), and the like are removed, whereby the concentration of an impurity in the oxide semiconductor film formed in the deposition chamber can be reduced.

In this embodiment, the oxygen release type oxide film 112 and the oxide semiconductor film 113 can be formed in succession without exposure to the air. When the oxygen release type oxide film 112 and the oxide semiconductor film 113 are formed successively in a vacuum without exposure to the air, impurities such as hydrogen and water can be prevented from being adsorbed onto a surface of the oxygen release type oxide film 112. Accordingly, the interface between the oxygen release type oxide film 112 and the oxide semiconductor film 113 can be kept clean.

Further, heat treatment may be performed on the oxide semiconductor film 113 in order to remove excess hydrogen (including water and a hydroxyl group) (to perform dehydration or dehydrogenation treatment). The temperature of the heat treatment is higher than or equal to 300° C. and lower than or equal to 700° C., or lower than the strain point of the substrate. The heat treatment can be performed under reduced pressure, a nitrogen atmosphere, an oxygen atmosphere, or the like. For example, after the substrate is put in an electric furnace which is a kind of heat treatment apparatus, the oxide semiconductor film is subjected to heat treatment at 450° C. for one hour in a nitrogen atmosphere.

Note that a heat treatment apparatus used is not limited to an electric furnace, and a device for heating a process object by heat conduction or heat radiation from a heating element such as a resistance heating element may be alternatively used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA may be performed as follows. The substrate is put in an inert gas heated at high temperature of 650° C. to 700° C., is heated for several minutes, and is taken out of the inert gas.

Figure 3A:
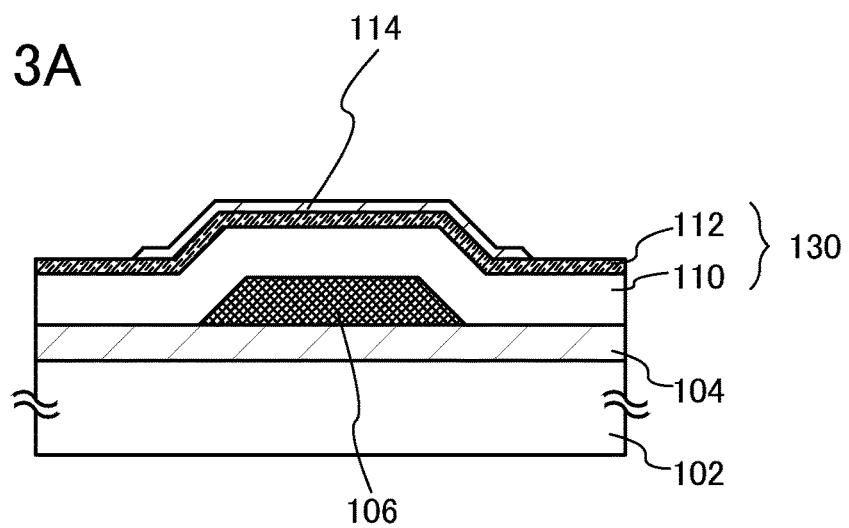
FIGS. 3A to 3C are diagrams illustrating embodiments of methods for manufacturing semiconductor devices.
Figure 3B:
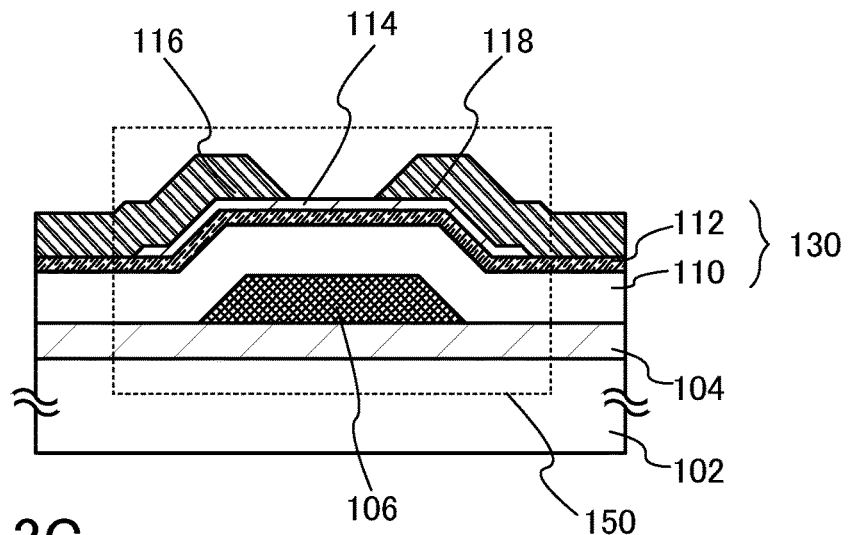
Figure 3C:
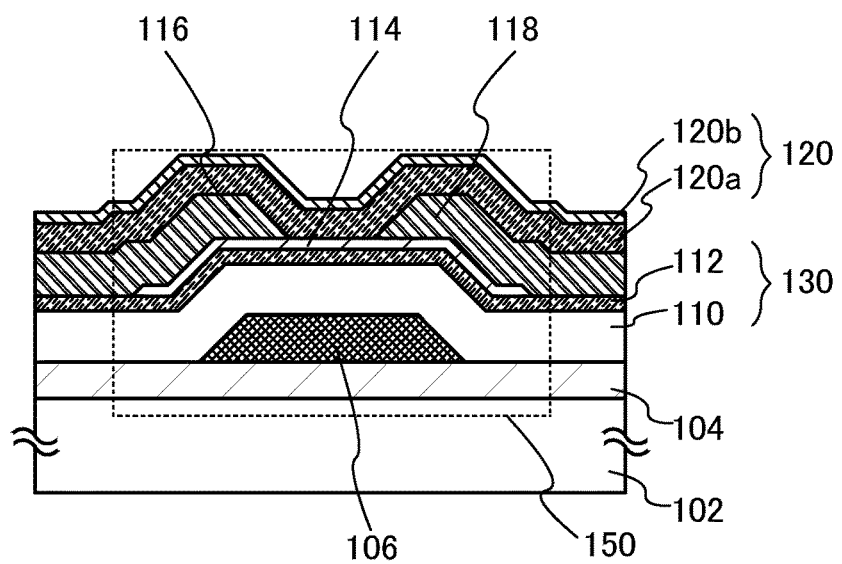

After that, a photolithography process and an etching step are performed on the oxide semiconductor film 113, so that the island-shaped oxide semiconductor film 114 is formed (see FIG. 3A).

The heat treatment for dehydration or dehydrogenation may be performed at any timing as long as it is performed after the oxide semiconductor film 113 is formed, after the island-shaped oxide semiconductor film 114 is formed, or after the source electrode 116 and the drain electrode 118 (which are formed later) are formed.

Note that in heat treatment, it is preferable that moisture, hydrogen, and the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, more preferably 7N (99.99999%) or higher (that is, the impurity concentration is preferably 1 ppm or lower, more preferably 0.1 ppm or lower).

In addition, after the oxide semiconductor film 114 is heated by the heat treatment, a high-purity oxygen gas, a high-purity dinitrogen monoxide gas, or ultra dry air (the moisture amount is 20 ppm or lower (−55° C. by conversion into a dew point), preferably 1 ppm or lower, further preferably 10 ppb or lower, in the case where measurement is performed with use of a dew point meter of a cavity ring down laser spectroscopy (CRDS) system) may be introduced into the same furnace. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably 6N or more, further preferably 7N or more (i.e., the impurity concentration in the oxygen gas or the dinitrogen monoxide gas is preferably 1 ppm or lower, further preferably 0.1 ppm or lower). By the effect of the oxygen gas or the dinitrogen monoxide gas, oxygen which is a main component of the oxide semiconductor and which has been reduced at the same time as the step for removing impurities by dehydration or dehydrogenation is supplied, so that the oxide semiconductor film 113 can be a high-purity and electrically i-type (intrinsic) oxide semiconductor film.

In addition, through the heat treatment, oxygen can be supplied to the oxide semiconductor film 113 from the oxygen release type oxide film 112.

Next, a conductive film is formed over the oxygen release type oxide film 112 and the oxide semiconductor film 114. A photolithography process and an etching step are performed on the conductive film, so that the source electrode 116 and the drain electrode 118 are formed. Accordingly, the transistor 150 is formed (see FIG. 3B). At this stage, the semiconductor device illustrated in FIG. 1A is formed.

As the conductive film used for the source electrode 116 and the drain electrode 118, for example, a metal film containing an element selected from Al, Cr, Cu, Ta, Ti, Mo, and W, or a metal nitride film containing any of the above elements as a component (e.g., a titanium nitride film, a molybdenum nitride film, or a tungsten nitride film) can be used. Alternatively, a film of a high-melting-point metal such as Ti, Mo, or W or a metal nitride film (e.g., a titanium nitride film, a molybdenum nitride film, or a tungsten nitride film) may be formed over or/and below the metal film such as an Al film or a Cu film.

Next, the protective film 120 is formed over the oxide semiconductor film 114, the source electrode 116, and the drain electrode 118 (see FIG. 3O). At this stage, the semiconductor device illustrated in FIG. 1B is formed.

The inorganic insulating film 120 can be formed using any of the following inorganic materials: silicon oxide, silicon oxynitride, silicon nitride oxide, silicon nitride, gallium oxide, zinc oxide, hafnium oxide, aluminum oxide, and the like. Note that the inorganic insulating film 120 may be formed by stacking a plurality of insulating films formed of any of these materials. In this embodiment, the inorganic insulating film 120 has a stacked structure of an oxygen release type oxide film 120a and a metal oxide film 120b, for example.

A silicon oxide film or the like containing more oxygen than the stoichiometric composition ratio is preferably used as the oxygen release type oxide film 120a. A silicon oxide film containing more oxygen than the stoichiometric composition ratio can provide oxygen to the oxide semiconductor film 114, so that generation of oxygen vacancies in the oxide semiconductor film 114 can be prevented. It is preferable that the oxygen release type oxide film 120a be formed using a material similar to that of the oxygen release type oxide film 112 which is part of the gate insulating film 130. With such a structure, oxygen can be supplied to the oxide semiconductor film 114 from thereover and therebelow when seen from a cross section, than is, from the oxygen release type oxide film 112 and the oxygen release type oxide film 120a, which is preferable. The thickness of the oxygen release type oxide film 120a can be greater than or equal to 50 nm and less than or equal to 400 nm (preferably, greater than or equal to 100 nm and less than or equal to 300 nm).

As the metal oxide film 120b, an aluminum oxide film can be used, for example. The aluminum oxide film preferably has a film density of 3.2 $g/cm^3$ or more, further preferably, 3.6 $g/cm^3$ or more. When the aluminum oxide film is used as the metal oxide film 120b, the inorganic insulating film 120 can have high moisture resistance. Further, the aluminum oxide film has high passivation quality and can suppress oxygen diffusion from the oxygen release type oxide film 120a. The thickness of the metal oxide film 120b can be greater than or equal to 30 nm and less than or equal to 150 nm (preferably greater than or equal to 50 nm and less than or equal to 100 nm).

Figure 4A:
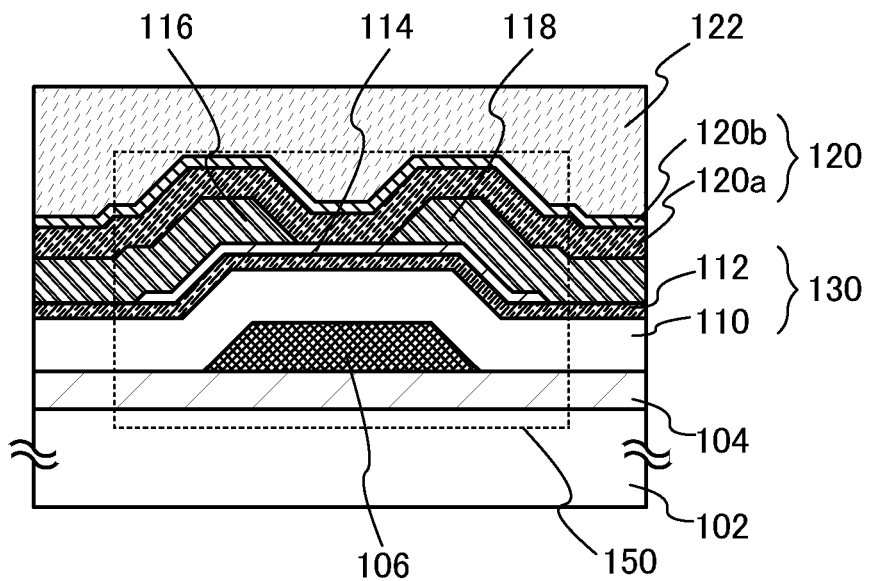
FIGS. 4A and 4B are diagrams illustrating an embodiment of a method for manufacturing a semiconductor device.

Next, the organic insulating film 122 is formed over the inorganic insulating film 120 (see FIG. 4A).

With the organic insulating film 122, the surface of the transistor 150 can be flat. As the organic insulating film 122, for example, an organic resin material such as a polyimide-based resin, an acrylic-based resin, or a benzocyclobutene-based resin can be used.

Figure 4B:
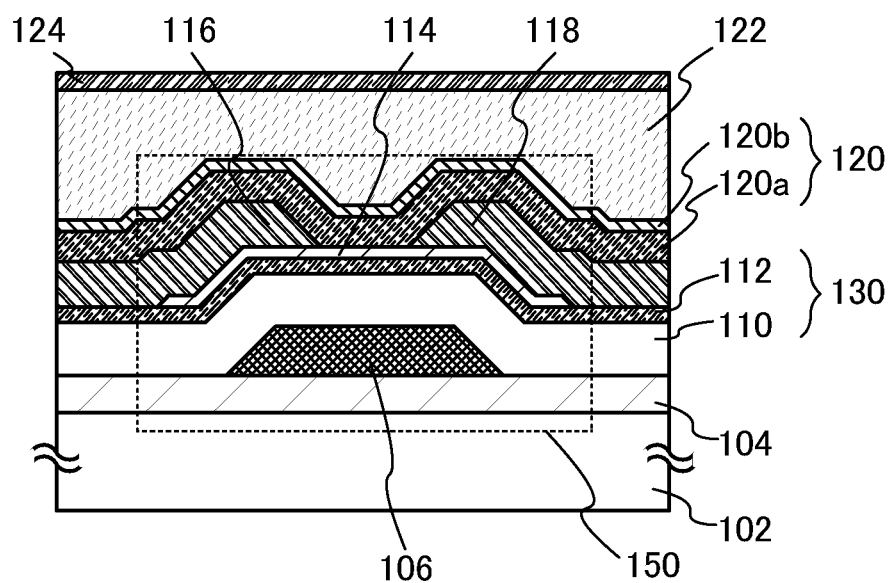

Next, the conductive film 124 is formed over the organic insulating film 122 (see FIG. 4B). At this stage, the semiconductor device illustrated in FIG. 1C is formed.

For the conductive film 124, a conductive material with a light-transmitting property, for example, indium tin oxide (ITO), indium tin oxide containing silicon or silicon oxide, indium zinc oxide, graphene, or the like can be used.

Note that the material of the conductive film 124 is not limited to the above. For example, a metal film (a film of aluminum, titanium, or the like) may be used. Such a metal film is preferably used because the transistor 150 can be shielded from light.

The conductive film 124 also has a function of shielding the transistor 150 from static charges (a so-called electrostatic discharge: ESD). With the conductive film 124 over the transistor 150, charge due to electrostatic discharge (ESD) or the like can be dissipated.

Through the above steps, the semiconductor devices in FIGS. 1A to 1C described in Embodiment 1 can be manufactured.

As described above, a gate insulating film including a silicon oxynitride film and an oxygen release type oxide film is formed in a semiconductor device including the oxide semiconductor film of this embodiment. Owing to the silicon oxynitride film, the gate insulating film can have high coverage, a high insulating property, and low defect density. Further, with the oxygen release type oxide film, oxygen can be supplied to the oxide semiconductor film. Thus, a semiconductor device with stable electric characteristics can be provided.

In addition, the oxygen release type oxide film and the oxide semiconductor film are formed successively in a vacuum without exposure to the air, whereby the interface between the oxygen release type oxide film and the oxide semiconductor film can be kept clean. Thus, a method for manufacturing a semiconductor device with stable electric characteristics can be provided.

This embodiment can be combined with any of the other embodiments as appropriate.

Embodiment 3

In this embodiment, a modification example of the semiconductor device in FIG. 1C of Embodiment 1 is described with reference to FIGS. 5A to 5C. Note that portions similar to those in FIGS. 1A to 1C are denoted by the same reference numerals, and a description thereof is skipped.

Figure 5A:
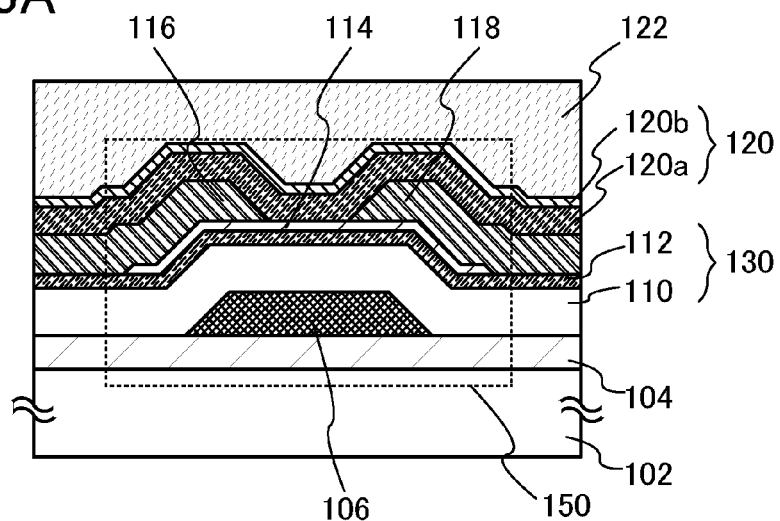
FIGS. 5A to 5C are diagrams illustrating embodiments of a semiconductor device and a method for manufacturing the semiconductor device.
Figure 5B:
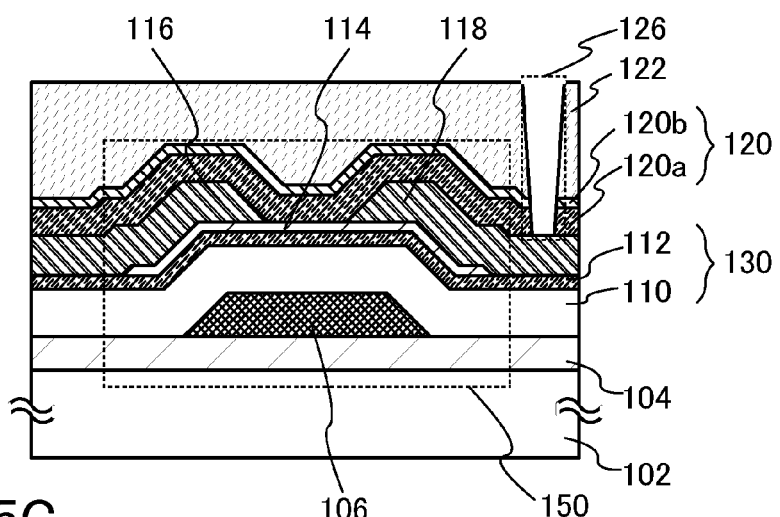
Figure 5C:
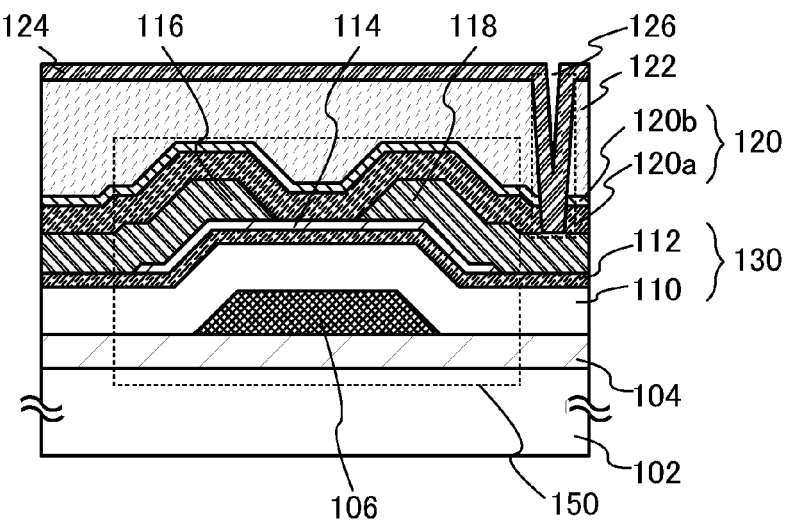

The semiconductor device in FIG. 5C is an example of this embodiment. FIGS. 5A and 5B illustrate a method for manufacturing the semiconductor device in FIG. 5C.

A semiconductor device in FIG. 5C includes the substrate 102, the base insulating film 104 over the substrate 102, the gate electrode 106 over the base insulating film 104, the silicon oxynitride film 110 over the base insulating film 104 and the gate electrode 106, the oxygen release type oxide film 112 formed over the silicon oxynitride film 110, the oxide semiconductor film 114 over the oxygen release type oxide film 112, the source electrode 116 over the oxygen release type oxide film 112 and the oxide semiconductor film 114, the drain electrode 118 over the oxygen release type oxide film 112 and the oxide semiconductor film 114, the inorganic insulating film 120 over the oxide semiconductor film 114, the source electrode 116, and the drain electrode 118, and the organic insulating film 122 over the inorganic insulating film 120, and the conductive film 124 over the organic insulating film 122.

In the semiconductor device in FIG. 5C, the gate insulating film 130 includes the silicon oxynitride film 110 and the oxygen release type oxide film 112, and the transistor 150 includes the substrate 102, the base insulating film 104, the gate electrode 106, the gate insulating film 130, the oxide semiconductor film 114, the source electrode 116, and the drain electrode 118.

Note that the transistor 150 has a structure similar to the structure of the semiconductor device in Embodiment 1 described with reference to FIGS. 1A to 1C. The inorganic insulating film 120 has a structure similar to the structure of the semiconductor device in Embodiment 1 with reference to FIGS. 1B and 1C. The organic insulating film 122 has a structure similar to the structure of the semiconductor device in Embodiment 1 described with reference to FIG. 1C. The transistor 150, the inorganic insulating film 120, and the organic insulating film 122 can be formed by the method and materials described above.

The transistor 150 in this embodiment is different from the transistor included in the semiconductor device in FIG. 1C in that an opening portion 126 is provided in the inorganic insulating film 120 and the organic insulating film 122. Further, the conductive film 124 formed over the organic insulating film 122 is connected to the drain electrode 118 through the inorganic insulating film 120 and the organic insulating film 122 in the opening portion 126.

With such a structure, the conductive film 124 can have the same potential as the drain electrode 118. In addition, the conductive film 124 can be used for various purposes. For example, in the case where the transistor 150 is a pixel transistor of a display device, the conductive film 124 can serve as a pixel electrode. Alternatively, the conductive film 124 may serve as a back gate (also referred to as a second gate electrode) of the transistor 150 and can control the threshold voltage (Vth) of the transistor 150. Further alternatively, in the case where a plurality of transistors is included, the conductive film 124 can serve as a connection electrode connecting the transistor 150 and another transistor to each other.

For the conductive film 124, a conductive material with a light-transmitting property, for example, indium tin oxide (ITO), indium tin oxide containing silicon or silicon oxide, indium zinc oxide, graphene, or the like can be used.

Note that the material of the conductive film 124 is not limited to the above. For example, a metal film (a film of aluminum, titanium, or the like) may be used. Such a metal film is preferably used because the transistor 150 can be shielded from light.

The conductive film 124 can be provided to overlap with the oxide semiconductor film 114. With such a structure, in a cross section, a potential on an upper side of the oxide semiconductor film 114 (i.e., a back-channel side) can be controlled. The potential of the conductive film may be in a floating state, the same as GND, the same as that of the gate electrode 106, or the same as those of the source electrode 116 and the drain electrode 118.

The conductive film 124 also has a function of shielding the transistor 150 from static charges (a so-called electrostatic discharge: ESD). With the conductive film 124 over the transistor 150, charge due to electrostatic discharge (ESD) or the like can be dissipated.

Here, the method for manufacturing the semiconductor device in FIG. 5C is described with reference to FIGS. 5A and 5B.

Note that FIG. 5A illustrates the semiconductor device in a cross section similar to the cross section of the semiconductor device in Embodiment 2 described with reference to FIG. 4A; thus, the semiconductor device in FIG. 5A can be manufactured by the method described with reference to FIGS. 2A to 2C and FIGS. 3A to 3C, and the description of the manufacturing method is skipped in this embodiment.

The opening portion 126 is formed in the inorganic insulating film 120 and the organic insulating film 122 over the transistor 150 (see FIG. 5B).

The opening portion 126 can be formed by patterning a desired region and by dry etching or wet etching. Dry etching and wet etching may be used in combination.

The opening portion 126 needs to reach the drain electrode 118, and the shape of the opening portion 126 is not particularly limited. For example, such a shape in which the inorganic insulating film 120 and the organic insulating film 122 have a stepwise shape or a perpendicular shape may be used. Note that when the inorganic insulating film 120 and the organic insulating film 122 are tapered as shown in FIG. 5A, the conductive film 124 formed in the following step can be formed without disconnections, which is preferable.

Next, the conductive film 124 is formed over the drain electrode 118, the organic insulating film 122, and the opening portion 126 (see FIG. 5C).

Through the above manufacturing steps, the semiconductor device shown in FIG. 5C can be manufactured.

As described above, a gate insulating film including a silicon oxynitride film and an oxygen release type oxide film is formed in a semiconductor device including the oxide semiconductor film of this embodiment. Owing to the silicon oxynitride film, the gate insulating film can have high coverage, a high insulating property, and low defect density. Further, with the oxygen release type oxide film, oxygen can be supplied to the oxide semiconductor film. Thus, a semiconductor device with stable electric characteristics can be provided.

This embodiment can be combined with any of the other embodiments as appropriate.

Embodiment 4

A semiconductor device having a display function (also referred to as a display device) can be manufactured using any of the transistors exemplified in Embodiments 1 to 3. Moreover, some or all of the driver circuits which include the transistor can be formed over a substrate where the pixel portion is formed, whereby a system-on-panel can be obtained.

Figure 6A:
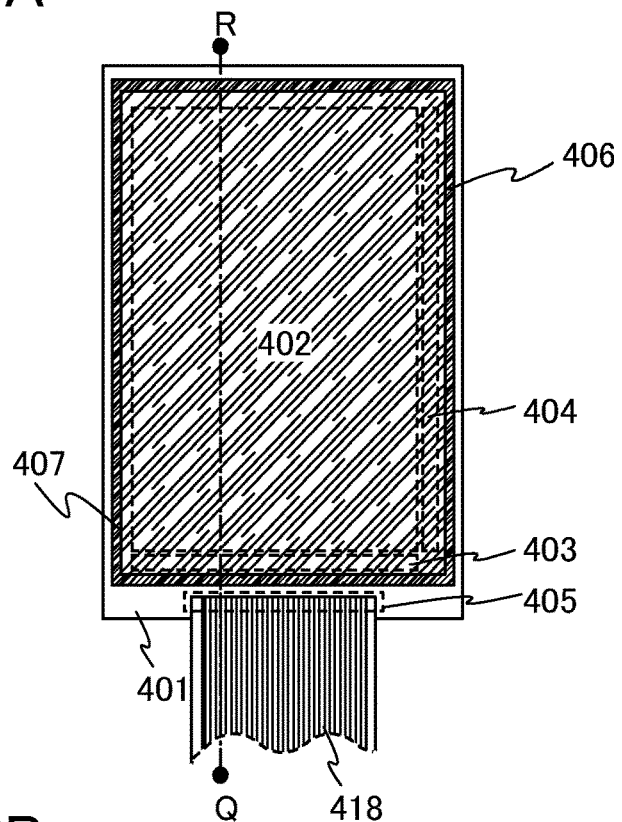
FIGS. 6A and 6B are diagrams illustrating a top view of an embodiment of a semiconductor device.

FIG. 6A is a structure including a pixel portion 402, a source driver circuit portion 403, and a gate driver circuit portion 404 which are provided over a first substrate 401. A sealant 406 is provided so as to surround the pixel portion 402, the source driver circuit portion 403, and the gate driver circuit portion 404. The pixel portion 402, the source driver circuit portion 403, and the gate driver circuit portion 404 are sealed with the sealant 406 between the first substrate 401 and a second substrate 407. The second substrate 407 is provided over the pixel portion 402, the source driver circuit portion 403, and the gate driver circuit portion 404. The pixel portion 402, the source driver circuit portion 403, and the gate driver circuit portion 404 are sealed together with a display element by the first substrate 401, the sealant 406, and the second substrate 407.

In FIG. 6A, a flexible printed circuit (FPC) terminal portion 405 which is electrically connected to the pixel portion 402, the source driver circuit portion 403, and the gate driver circuit portion 404 is provided in a region over the first substrate 401 that is different from the region surrounded by the sealant 406. An FPC 418 is connected to the FPC terminal portion 405. Signals and potentials applied to the pixel portion 402, the source driver circuit portion 403, and the gate driver circuit portion 404 are supplied through the FPC 418.

In FIG. 6A, an example in which the source driver circuit portion 403 and the gate driver circuit portion 404 are formed over the first substrate 401 where the pixel portion 402 is also formed is described; however, the structure is not limited thereto. For example, only the gate driver circuit portion 404 may be formed over the first substrate 401 or only the source driver circuit portion 403 may be formed over the first substrate 401. In this case, a substrate where a source driver circuit, a gate driver circuit, or the like is formed (e.g., a driver-circuit substrate formed using a single-crystal semiconductor film or a polycrystalline semiconductor film) may be mounted on the first substrate 401.

The connection method of such a separately formed driver circuit substrate is not particularly limited; for example, a chip on glass (COG) method, a wire bonding method, or a tape automated bonding (TAB) method can be used.

In addition, the display device includes a panel in which the display element is sealed, and a module in which an IC or the like including a controller is mounted on the panel.

Note that a display device in this specification means an image display device, a display device, or a light source (including a lighting device). Further, the display device includes any of the following modules in its category: a module including a connector such as a flexible printed circuit (FPC), tape automated bonding (TAB) tape, or tape carrier package (TCP); a module including TAB tape or TCP which is provided with a printed wiring board at the end thereof; and a module including an integrated circuit (IC) which is directly mounted on a display element by a chip on glass (COG) method.

In addition, the pixel portion 402, the source driver circuit portion 403, and the gate driver circuit portion 404 provided over the first substrate 401 each include a plurality of transistors. The plurality of transistors can be the transistors exemplified in Embodiments 1 to 3. For example, a structure example of the transistors included in the pixel portion 402 and the source driver circuit portion 403 of the semiconductor device in FIG. 6A is illustrated in FIG. 6B.

Figure 6B:
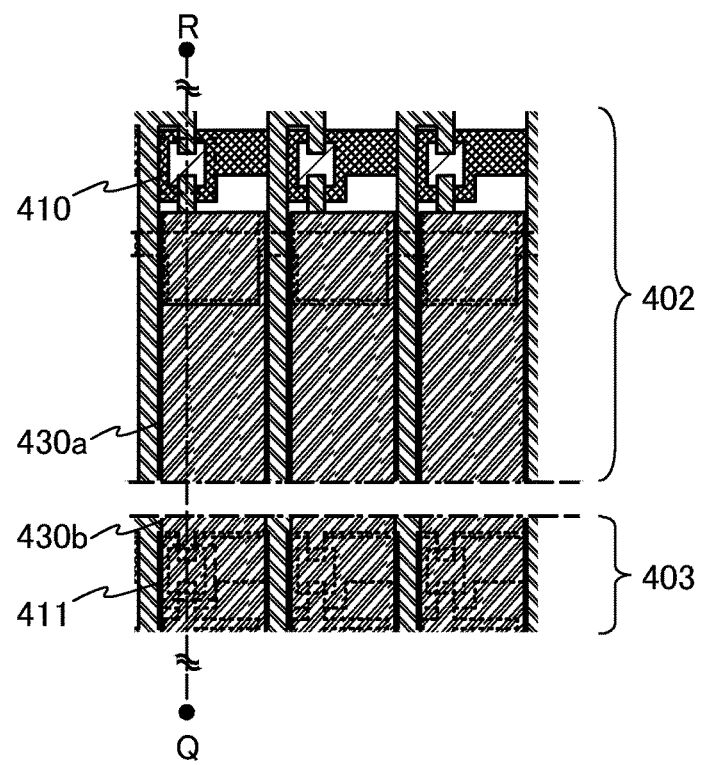

FIG. 6B is an enlarged view of the semiconductor device taken along a broken line Q-R of FIG. 6A. The pixel portion 402 includes a plurality of transistors including the transistor 410. The source driver circuit portion 403 includes a plurality of transistors including the transistor 411. Note that in FIG. 6B, some of components (e.g., a gate insulating film and an inorganic insulating film) are omitted in order to avoid complexity of the drawing.

The transistor 410 included in the pixel portion 402 can switch and control pixels provided in a matrix. The transistor 411 included in the source driver circuit portion 403 can select and control source lines connected to the pixels provided in a matrix.

In addition, in this embodiment, the transistor 410 included in the pixel portion 402 does not include a conductive film in an upper portion, and the transistor 411 included in the source driver circuit portion 403 includes a conductive film in an upper portion.

In addition, as a display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Figure 7A:
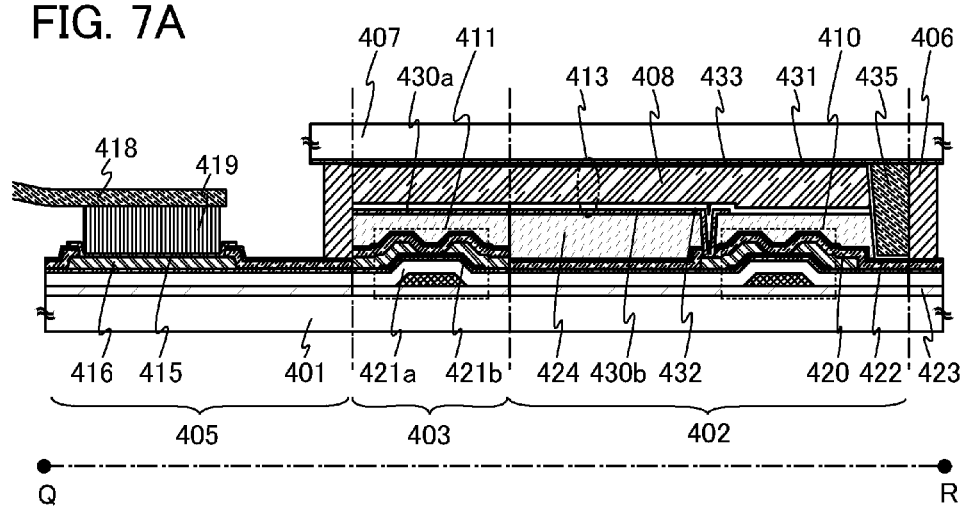
FIGS. 7A and 7B are diagrams illustrating cross sections of embodiments of a semiconductor device.
Figure 7B:
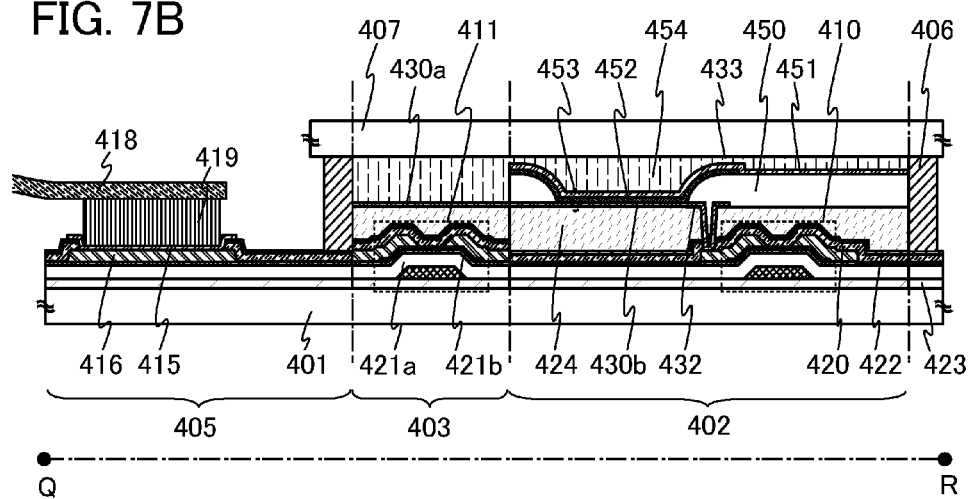

One embodiment of the display element provided in a display device is described with reference to FIGS. 7A and 7B. FIGS. 7A and 7B are cross-sectional views of the semiconductor devices taken along broken lines Q-R in FIGS. 6A and 6B.

The semiconductor device in FIGS. 7A and 7B includes a connection terminal electrode layer 415 and a terminal electrode layer 416 in the FPC terminal portion 405 over the first substrate 401. The connection terminal electrode layer 415 and the terminal electrode layer 416 are electrically connected to a terminal of the FPC 418 with an anisotropic conductive film 419 provided therebetween.

The connection terminal electrode layer 415 is formed in the same step as conductive films 430a and 430b. The terminal electrode layer 416 is formed in the same step as source electrodes and drain electrodes of the transistors 410 and 411.

Further, the pixel portion 402 and the source driver circuit 403 over the first substrate 401 include a plurality of transistors. As the plurality of transistors, the transistor 410 included in the pixel portion 402 and the transistor 411 included in the source driver circuit portion 403 are exemplified in FIGS. 7A and 7B.

Note that in this embodiment, the transistor 410 included in the pixel portion 402 and the transistor 411 included in the source driver circuit portion 403 have in the same size; however, there is no limitation thereto. The transistor used in the pixel portion 402 and the transistor used in the source driver circuit portion 403 can be appropriately changed in size (L/W) or in the transistor count. The gate driver circuit portion 404 is not illustrated in FIGS. 7A and 7B; however, the gate driver circuit portion 404 can have the structure similar to that of the source driver circuit portion 403. Note that the portion to which the gate driver circuit portion 404 is connected, the connecting method, and the like are different from those of the gate driver circuit portion 403.

In addition, in the transistors 410 and 411 in FIGS. 7A and 7B, a gate insulating film includes a silicon oxynitride film 421a and an oxygen release type oxide film 421b. The oxygen release type oxide film 421b is provided in contact with an oxide semiconductor film and can supply oxygen to the oxide semiconductor film. Thus, generation of carriers due to oxygen deficiency in the oxide semiconductor film is suppressed in the transistors 410 and 411, and thus, the transistors 410 and 411 are electrically stable.

As described above, when the transistors 410 and 411 are used in the semiconductor device in this embodiment in FIGS. 6A and 6B, the semiconductor device with high reliability can be provided.

In addition, inorganic insulating films 420 and 422 and an organic insulating film 424 are provided over the transistors 410 and 411 in FIGS. 7A and 7B. Note that the insulating film 423 is a base insulating film serving as a base film.

In this embodiment, a silicon oxide film is used as the inorganic insulating film 420, and an aluminum oxide film is used as the inorganic insulating film 422. Note that the inorganic insulating film 420 and the inorganic insulating film 422 can be formed by a sputtering method or a plasma CVD method.

The silicon oxide film serving as the inorganic insulating film 420 is provided in contact with the oxide semiconductor film and can supply oxygen to the oxide semiconductor film.

The aluminum oxide film provided as the inorganic insulating film 422 has a high blocking effect and thus is less likely to transmit both oxygen and an impurity such as hydrogen or moisture. Therefore, in and after the manufacturing process, the aluminum oxide film functions as a protective film for preventing entry of an impurity such as hydrogen or moisture, which causes a change in characteristics, into the oxide semiconductor film, and for preventing release of oxygen, which is a main component material of the oxide semiconductor film, from the oxide semiconductor film.

The organic insulating film 424 can be formed using an organic material having heat resistance, such as an acrylic-based resin, a polyimide-based resin, a benzocyclobutene-based resin, a polyamide-based resin, or an epoxy-based resin. Note that the organic insulating film 424 may be formed by stacking a plurality of insulating films formed using any of these materials.

In this embodiment, the transistor 411 included in the source driver circuit portion 403 has a structure in which the conductive film 430a is provided over the organic insulating film 424 to overlap with a channel formation region of the oxide semiconductor film. However, without limitation to this structure, the conductive film 430a is not necessarily provided. By providing the conductive film 430a so as to overlap with the channel formation regions of the oxide semiconductor film, the amount of change in the threshold voltage of the transistor 411 between before and after the BT test can be reduced. The conductive film 430a may have the same potential as or have potential different from that of gate electrode layers of the transistor 411 and can each function as a second gate electrode layer. The potential of the conductive film 430a may be GND or 0 V, or the conductive film 430a may be in a floating state.

Note that the conductive film 430a has a function of blocking an external electric field (particularly, to block static electricity), that is, to prevent an external electric field from acting on the inside (a circuit portion including the transistor 411). Such a blocking function of the conductive film 430a can prevent variation in electric characteristics of the transistor 411 due to the influence of an external electric field such as static electricity. Note that the conductive film 430a may be formed in a wide range of area so as to overlap with the transistor 411. Accordingly, the function of blocking static electricity is further improved.

In this embodiment, the transistor 410 included in the pixel portion 402 has a structure in which the conductive film 430b in contact with the source electrode or the drain electrode is provided over the organic insulating film 424. The conductive film 430b serves as a pixel electrode in the pixel portion 402. Note that in the transistor 410 included in the pixel portion 402 in this embodiment, the conductive film 430b is not provided to overlap with a channel formation region of the oxide semiconductor film. However, without limitation to this structure, the transistor 410 may have the structure similar to that of the transistor 411 included in the source driver circuit portion 403.

The transistor 410 included in the pixel portion 402 is electrically connected to the display element, which is included in a display panel. A variety of display elements can be used as the display element as long as display can be performed.

An example of a liquid crystal display device using a liquid crystal element as a display element is illustrated in FIG. 7A. In FIG. 7A, a liquid crystal element 413 which is a display element includes the conductive film 430b, a counter electrode 431, and a liquid crystal layer 408. In addition, an insulating film 432 and an insulating film 433 each functioning as an alignment film are provided so that the liquid crystal layer 408 is provided therebetween. The counter electrode 431 is provided on the second substrate 407 side and stacked over the conductive film 430b with the liquid crystal layer 408 provided therebetween.

A spacer 435 is a columnar spacer obtained by selective etching of an insulating film and is provided in order to control the thickness (a cell gap) of the liquid crystal layer 408. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes a liquid crystal showing a blue phase and a chiral agent has a short response time and has optical isotropy, which makes the alignment process unneeded and the viewing angle dependence small. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased. A transistor including an oxide semiconductor film has a possibility that the electric characteristics of the transistor may vary significantly by the influence of static electricity and deviate from the designed range. Therefore, it is more effective to use a liquid crystal material exhibiting a blue phase for the liquid crystal display device including the transistor that includes the oxide semiconductor film.

The specific resistivity of the liquid crystal material is greater than or equal to $1\times10^9$ Ω·cm, preferably greater than or equal to $1\times10^{11}$ Ω·cm, more preferably greater than or equal to $1\times10^{12}$ Ω·cm. Note that the specific resistance in this specification is measured at 20° C.

The size of storage capacitor formed in the liquid crystal display device is set considering the leakage current of the transistor provided in the pixel portion or the like so that charge can be held for a predetermined period. The size of the storage capacitor may be set considering the off-state current of a transistor or the like. By using a transistor including an oxide semiconductor film which is highly purified and in which formation of an oxygen vacancy is suppressed, it is enough to provide a storage capacitor having a capacitance that is ⅓ or less, preferably ⅕ or less of liquid crystal capacitance of each pixel.

In the transistor used in this embodiment, which includes an oxide semiconductor layer which is highly purified and in which formation of an oxygen vacancy is suppressed, the current in an off state (off-state current) can be made small. Accordingly, an electrical signal such as an image signal can be held for a longer period in the pixel, and a writing interval can be set longer in an on state. Accordingly, frequency of refresh operation can be reduced, which leads to an effect of suppressing power consumption.

The transistor used in this embodiment, which includes an oxide semiconductor layer which is highly purified and in which formation of an oxygen vacancy is suppressed, can have relatively high field-effect mobility and thus can operate at high speed. For example, with such a transistor which can operate at high speed used for a liquid crystal display device, a switching transistor in a pixel portion and a driver transistor in a driver circuit portion can be formed over one substrate. That is, since a semiconductor device formed of a silicon wafer or the like is not additionally needed as a driver circuit, the number of components of the semiconductor device can be reduced. In addition, by using a transistor which can operate at high speed in a pixel portion, a high-quality image can be provided.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. Some examples can be given as the vertical alignment mode. For example, a multi-domain vertical alignment (MVA) mode, a patterned vertical alignment (PVA) mode, or an advanced super view (ASV) mode can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that the disclosed invention is not limited to the application to a display device for color display; the disclosed invention can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes has a light-transmitting property. A transistor and a light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

FIG. 7B illustrates an example of a light-emitting device using a light-emitting element as a display element. A light-emitting element 453 which is a display element is electrically connected to the transistor 410 provided in the pixel portion 402. Note that the structure of the light-emitting element 453 is not limited to a stacked structure of the conductive film 430b, an electroluminescent layer 452, and an upper electrode 451. The structure of the light-emitting element 453 can be changed as appropriate depending on the direction in which light is extracted from the light-emitting element 453, or the like.

A partition 450 is formed using an organic insulating material or an inorganic insulating material. It is particularly preferable that the partition be formed using a photosensitive resin material to have an opening portion in the conductive film 430b so that a sidewall of the opening portion is formed as an inclined surface with continuous curvature.

The electroluminescent layer 452 may be formed with a single layer or a plurality of layers stacked.

A protective film may be formed over the upper electrode 451 and the partition 450 in order to prevent oxygen, hydrogen, moisture, carbon dioxide, or the like from entering the light-emitting element 453. As the protective film, a silicon nitride film, a silicon nitride oxide film, a DLC film, or the like can be formed. In addition, in a space which is formed with the first substrate 401, the second substrate 407, and the sealant 406, a filler 454 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 454, an ultraviolet curable resin or a thermosetting resin can be used, in addition to an inert gas such as nitrogen or argon. For example, PVC (polyvinyl chloride), acrylic resin, polyimide, an epoxy resin, a silicone resin, PVB (polyvinyl butyral), or EVA (ethylene vinyl acetate) can be used. For example, nitrogen is used for the filler 454.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

In FIGS. 7A and 7B, as the first substrate 401 and the second substrate 407, flexible substrates, for example, plastic substrates having a light-transmitting property can be used as well as glass substrates. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

As described above, by using any of the transistors described in Embodiments 1 to 3, a semiconductor device having a variety of functions can be provided.

This embodiment can be implemented in appropriate combination with the structures described in the other embodiments.

Embodiment 5

A semiconductor device disclosed in this specification can be applied to a variety of electronic appliances (including game machines). Examples of the electronic devices are a television device (also referred to as a television or a television receiver), a monitor of a computer or the like, electronic paper, a camera such as a digital camera or a digital video camera, a digital photo frame, a mobile phone (also referred to as a mobile telephone or a mobile phone device), a portable game console, a portable digital assistant (PDA), a portable terminal (a smart phone, a tablet PC, and the like are included), an audio reproducing device, a large-sized game machine such as a pachinko machine, and the like. Examples of electronic appliances each including the semiconductor device described in the above embodiment are described with reference to FIGS. 8A to 8C and FIGS. 9A1, 9A2, 9A3, and 9B.

Figure 8A:
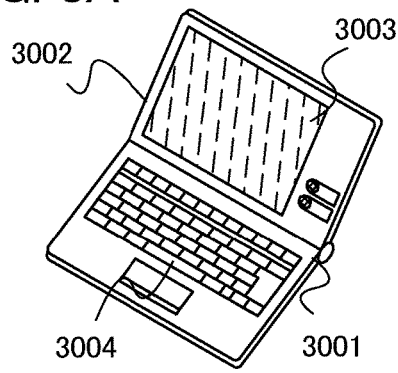
FIGS. 8A to 8F are diagrams illustrating electronic devices.

FIG. 8A illustrates a laptop personal computer, which includes a main body 3001, a housing 3002, a display portion 3003, a keyboard 3004, and the like. The semiconductor device described in any of the above embodiments is applied to the display portion 3003, whereby a highly reliable laptop personal computer can be provided.

Figure 8B:
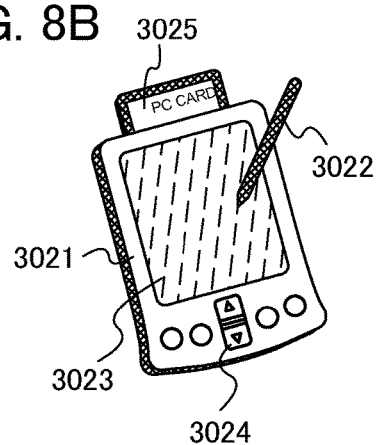

FIG. 8B is a personal digital assistant (PDA) including a display portion 3023, an external interface 3025, an operation button 3024, and the like in a main body 3021. A stylus 3022 is included as an accessory for operation. The semiconductor device described in any of the above embodiments is applied to the display portion 3023, whereby a highly reliable personal digital assistant (PDA) can be provided.

Figure 8C:
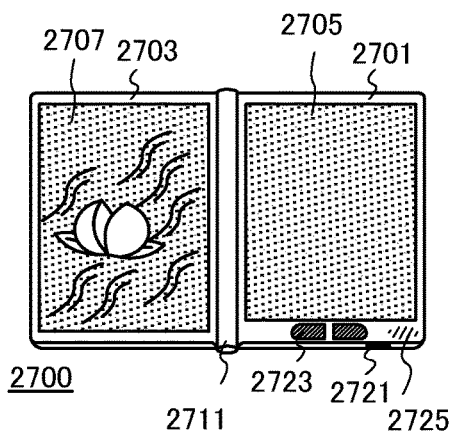

FIG. 8C illustrates an example of an e-book reader. For example, the e-book reader 2700 includes two housings, a housing 2701 and a housing 2703. The housing 2701 and the housing 2703 are combined with a hinge portion 2711 so that the e-book reader 2700 can be opened and closed with the hinge portion 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the structure where different images are displayed in different display portions, for example, the right display portion (the display portion 2705 in FIG. 8C) can display text and the left display portion (the display portion 2707 in FIG. 8C) can display images. The semiconductor device described in any of the above embodiments is applied to the display portion 2705 and the display portion 2707, whereby the highly reliable e-book reader 2700 can be provided. In the case of using a transflective or reflective liquid crystal display device as the display portion 2705, the e-book reader may be used in a comparatively bright environment; therefore, a solar cell may be provided so that power generation by the solar cell and charge by a battery can be performed. When a lithium ion battery is used as the battery, there are advantages of downsizing and the like.

FIG. 8C illustrates an example in which the housing 2701 is provided with an operation portion and the like. For example, the housing 2701 is provided with a power switch 2721, operation keys 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Figure 8D:
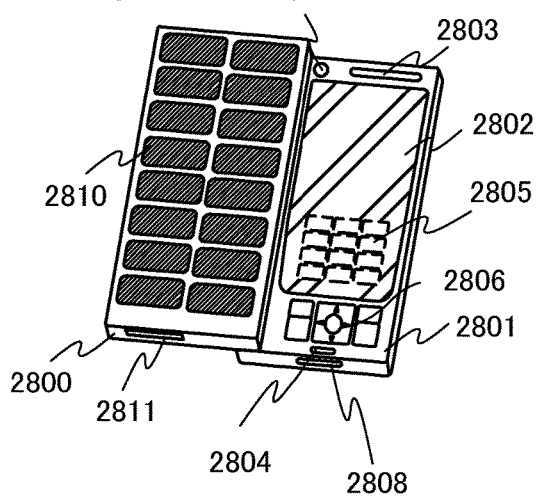

FIG. 8D illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the portable information terminal, an external memory slot 2811, and the like. Further, an antenna is incorporated in the housing 2801. The semiconductor device described in any of the above embodiments is applied to the display panel 2802, whereby a highly reliable mobile phone can be provided.

The display panel 2802 is provided with a touch panel. A plurality of operation keys 2805 which is displayed as images is illustrated by dashed lines in FIG. 8D. Note that a boosting circuit by which a voltage output from the solar cell 2810 is increased to be sufficiently high for each circuit is also included.

In the display panel 2802, the display direction can be appropriately changed depending on a usage pattern. Further, the display device is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housing 2800 and the housing 2801 developed as illustrated in FIG. 8D can be slid so that one is lapped over the other; thus, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided.

Figure 8E:
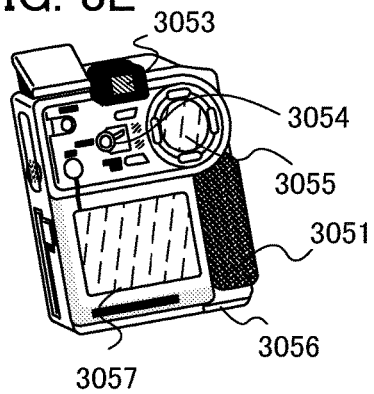

FIG. 8E illustrates a digital video camera which includes a main body 3051, a display portion A 3057, an eyepiece 3053, an operation switch 3054, a display portion B 3055, a battery 3056, and the like. By applying the semiconductor device described in any of the above embodiments to the display portion A 3057 and the display portion B 3055, a highly-reliable digital video camera can be obtained.

Figure 8F:
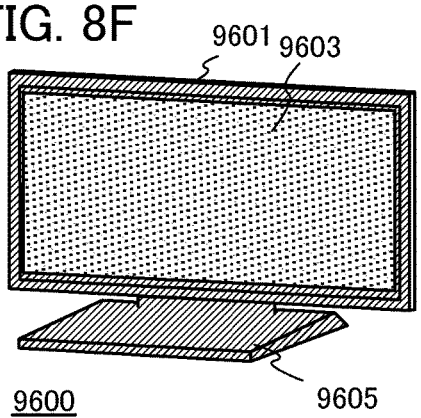

FIG. 8F illustrates an example of a television set. In the television set 9600, a display portion 9603 is incorporated in a housing 9601. The display portion 9603 can display images. Here, the housing 9601 is supported by a stand 9605. The semiconductor device described in any of the above embodiments is applied to the display portion 9603, whereby the highly reliable television set 9600 can be provided.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

FIGS. 9A1, 9A2, 9A3, and 9B illustrate examples of a tablet PC. FIGS. 9A1, 9A2, and 9A3 illustrate a tablet PC 5000. FIG. 9B illustrates a tablet PC 6000.

FIGS. 9A1, 9A2, and 9A3 are a front view, a side view, and a rear view of the tablet PC 5000, respectively. FIG. 9B is a front view of the tablet PC 6000.

The tablet PC 5000 includes a housing 5001, a display portion 5003, a power button 5005, a front camera 5007, a rear camera 5009, a first external connection terminal 5011, a second external connection terminal 5013, and the like.

In addition, the display portion 5003 is incorporated in the housing 5001 and can be used as a touch panel. For example, e-mailing or schedule management can be performed by touching an icon 5015 and the like on the display portion 5003. Further, the front camera 5007 is incorporated on the front side of the housing 5001, whereby an image on the user's side can be taken. The rear camera 5009 is incorporated in the rear side of the housing 5001, whereby an image on the opposite side of the user can be taken. Further, the housing 5001 includes the first external connection terminal 5011 and the second external connection terminal 5013. Sound can be output to an earphone or the like through the first external connection terminal 5011, and data can be moved through the second external connection terminal 5013, for example.

The tablet PC 6000 in FIG. 9B includes a first housing 6001, a second housing 6003, a hinge portion 6005, a first display portion 6007, a second display portion 6009, a power button 6011, a first camera 6013, a second camera 6015, and the like.

The first display portion 6007 is incorporated in the first housing 6001. The second display portion 6009 is incorporated in the second housing 6003. For example, the first display portion 6007 and the second display portion 6009 are used as a display panel and a touch panel, respectively. By looking at a text icon 6017 displayed on the first display portion 6007 by touching the icon 6019 or a keyboard 6021 (a keyboard image, actually) displayed on the second display portion 6009, image selecting, text input, and the like can be made. Alternatively, the first display portion 6007 and the second display portion 6009 may be a touch panel and a display panel, respectively, or the first display portion 6007 and the second display portion 6009 may be touch panels.

The first housing 6001 and the second housing 6003 are connected to each other and open and close on the hinge portion 6005. When the display portion 6007 incorporated in the first housing 6001 and the display portion 6009 incorporated in the second housing 6003 are faced each other in carrying the tablet PC 6000, the surfaces of the display portion 6007 and the display portion 6009 (e.g., plastic substrates) can be protected, which is preferable.

Alternatively, the first housing 6001 and the second housing 6003 may be separated by the hinge portion 6005 (so-called convertible type). Thus, the application range of the tablet PC 6000 can be extended, and for example, the first housing 6001 is used in a vertical orientation and the second housing 6003 is used in a horizontal orientation.

Further, the first camera 6013 and the second camera 6015 can take 3D images.

The tablet PC 5000 and the tablet PC 6000 may send and receive data wirelessly. For example, through wireless internet connection, desired data can be purchased and downloaded.

The tablet PCs 5000 and 6000 can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs). A detector such as a photodetector capable of optimizing display luminance in accordance with the amount of outside light or a sensor for detecting the inclination of a gyrosensor or an acceleration sensor can be included.

When the semiconductor device in the above embodiment is used for the display portion 5003 of the tablet PC 5000, the first display portion 6007 of the tablet PC 6000, and/or the second display portion 6009, the semiconductor device with high reliability can be provided.

This embodiment can be implemented in appropriate combination with the structures described in the other embodiments.

Example 1

In this example, an oxygen release type oxide film which can be used in one embodiment of the present invention was evaluated.

The oxygen release type oxide film was evaluated by thermal desorption spectroscopy (TDS).

As evaluation samples, three samples of a silicon nitride film, a silicon oxynitride film, and a silicon oxide film were formed. The silicon nitride film was Sample 1, the silicon oxynitride film was Sample 2, and the silicon oxide film was Sample 3.

Details of structures and formation conditions of the samples are described below.
(Sample 1)

A silicon nitride film ($SiN_x$) was deposited over a glass substrate with the use of a PE-CVD apparatus under the following conditions: $SiH_4/H_2/NH_3$=30 sccm/800 sccm/300 sccm, deposition power=600 W (RF), deposition pressure=60 Pa, and substrate temperature=330° C. Note that the thickness of the glass substrate was 0.7 mm and the thickness of the silicon nitride film was 100 nm.
(Sample 2)

A silicon oxynitride film (SiON) was deposited over a glass substrate with the use of a PE-CVD apparatus under the following conditions: $SiH_4/N_2O$=10 sccm/1200 sccm, deposition power=30 W (RF), deposition pressure=22 Pa, and substrate temperature=330° C. Note that the thickness of the glass substrate was 0.7 mm and the thickness of the silicon oxynitride film was 150 nm.
(Sample 3)

A silicon oxide film ($SiO_x$) was formed over a glass substrate by a sputtering apparatus under the following conditions: $O_2$=50 sccm ($O_2$=100%), deposition power=10 kW (DC-Pulse power source, Pulse=300 kHz), deposition pressure=0.4 Pa, and substrate temperature=room temperature (RT). Note that the thickness of the glass substrate was 0.7 mm and the thickness of the silicon oxide film was 100 nm.

Next, TDS analysis was performed on the Samples 1 to 3. Note that TDS analysis is an analysis method in which each sample is heated in a vacuum case and a gas component generated from each sample when the temperature of the sample is increased is detected by a quadrupole mass spectrometer. Detected gas components are distinguished from each other by the ionic strength of m/z (mass/charge). Note that in this example, the ionic strength of m/z=32 was identified to oxygen.

Figure 10A:
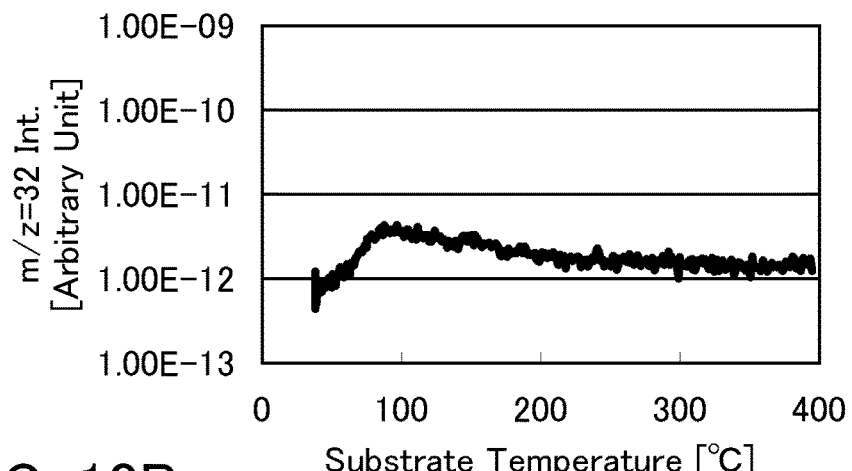
FIGS. 10A to 10C are diagrams showing results of TDS measurement.
Figure 10B:
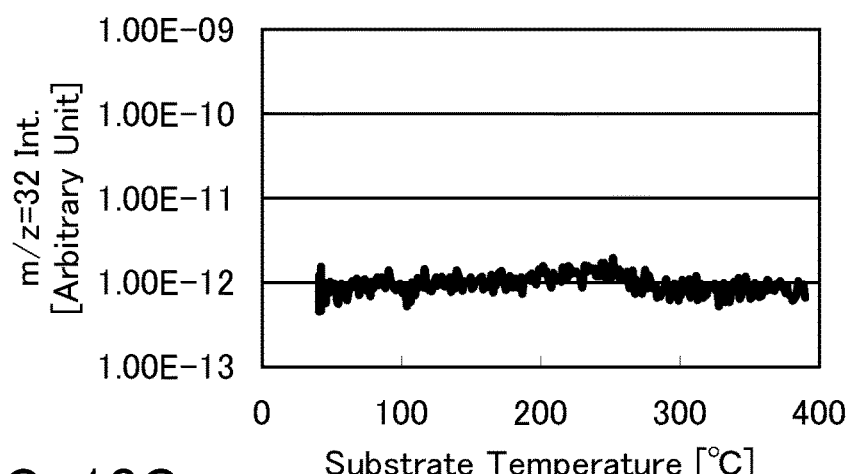
Figure 10C:
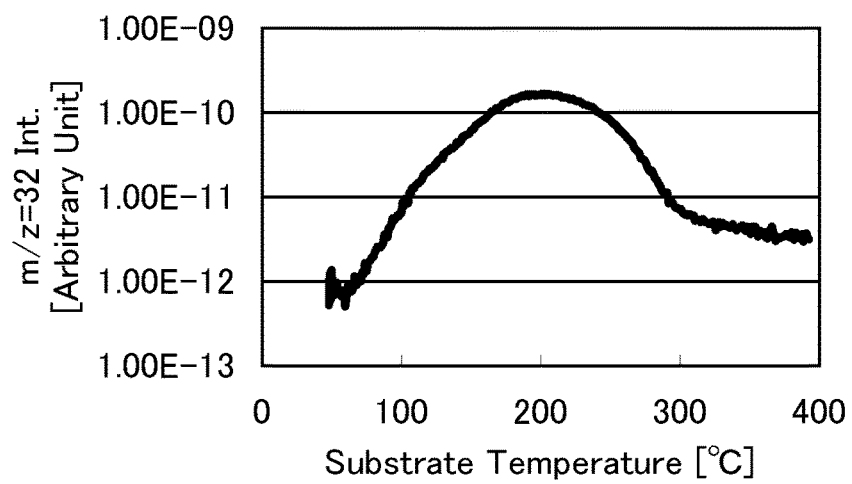

FIGS. 10A to 10C show TDS measurement results of Samples 1 to 3, respectively. Note that in FIGS. 10A to 10C, the vertical axis and the horizontal axis represent substrate temperature (° C.) and ionic strength of m/z=32 (arbitrary unit), respectively.

As shown in FIGS. 10A and 10B, the detectable amount of ion with ionic strength of m/z=32 is small in the silicon nitride film (Sample 1) and the silicon oxynitride film (Sample 2) formed with the PE-CVD apparatus. On the other hand, as show in FIG. 10C, in the silicon oxide film (Sample 3) formed by the sputtering method, the detectable amount of ion with ionic strength of m/z=32 is large, in particular, from 100° C. to 300° C.

Here, the ionic strength of m/z=32 of the silicon oxide film (Sample 3) was quantified to calculate the amount of released oxygen. Note that the detectable amounts of ion with ionic strength of m/z=32 were small in the silicon nitride film (Sample 1) and the silicon oxynitride film (Sample 2) and were thus difficult to be quantified. As a result of the quantification, the amount of oxygen released from the silicon oxide film (Sample 3) was $4.5 \times 10^{20}$ atoms/$cm^3$ on the number of oxygen atoms.

Then, TDS measurement was performed on samples different from Samples 1 to 3. Details of structures and formation conditions of the samples are described below. Note that TDS measurement was performed in a way similar to Samples 1 to 3, and thus, detailed description is skipped.
(Sample 4)

A silicon oxide film ($SiO_x$) was formed over a glass substrate by a sputtering apparatus under the following conditions: $O_2$=300 sccm ($O_2$=100%), deposition power=24 kW (AC), deposition pressure=0.7 Pa, and substrate temperature=room temperature (RT). Note that the thickness of the glass substrate was 0.7 mm and the thickness of the silicon oxide film was 100 nm.
(Sample 5)

A silicon oxide film ($SiO_x$) was formed over a glass substrate by a sputtering apparatus under the following conditions: $O_2$=300 sccm ($O_2$=100%), deposition power=24 kW (AC), deposition pressure=0.7 Pa, and substrate temperature=50° C. Note that the thickness of the glass substrate was 0.7 mm and the thickness of the silicon oxide film was 100 nm.
(Sample 6)

A silicon oxide film ($SiO_x$) was formed over a glass substrate by a sputtering apparatus under the following conditions: $O_2$=300 sccm ($O_2$=100%), deposition power=24 kW (AC), deposition pressure=0.7 Pa, and substrate temperature=80° C. Note that the thickness of the glass substrate was 0.7 mm and the thickness of the silicon oxide film was 100 nm.
(Sample 7)

A silicon oxide film ($SiO_x$) was formed over a glass substrate by a sputtering apparatus under the following conditions: $O_2$=300 sccm ($O_2$=100%), deposition power=24 kW (AC), deposition pressure=0.7 Pa, and substrate temperature=150° C. Note that the thickness of the glass substrate was 0.7 mm and the thickness of the silicon oxide film was 100 nm.
(Sample 8)

A silicon oxide film ($SiO_x$) was formed over a glass substrate by a sputtering apparatus under the following conditions: $O_2$=300 sccm ($O_2$=100%), deposition power=24 kW (AC), deposition pressure=0.7 Pa, and substrate temperature=200° C. Note that the thickness of the glass substrate was 0.7 mm and the thickness of the silicon oxide film was 100 nm.

Figure 11:
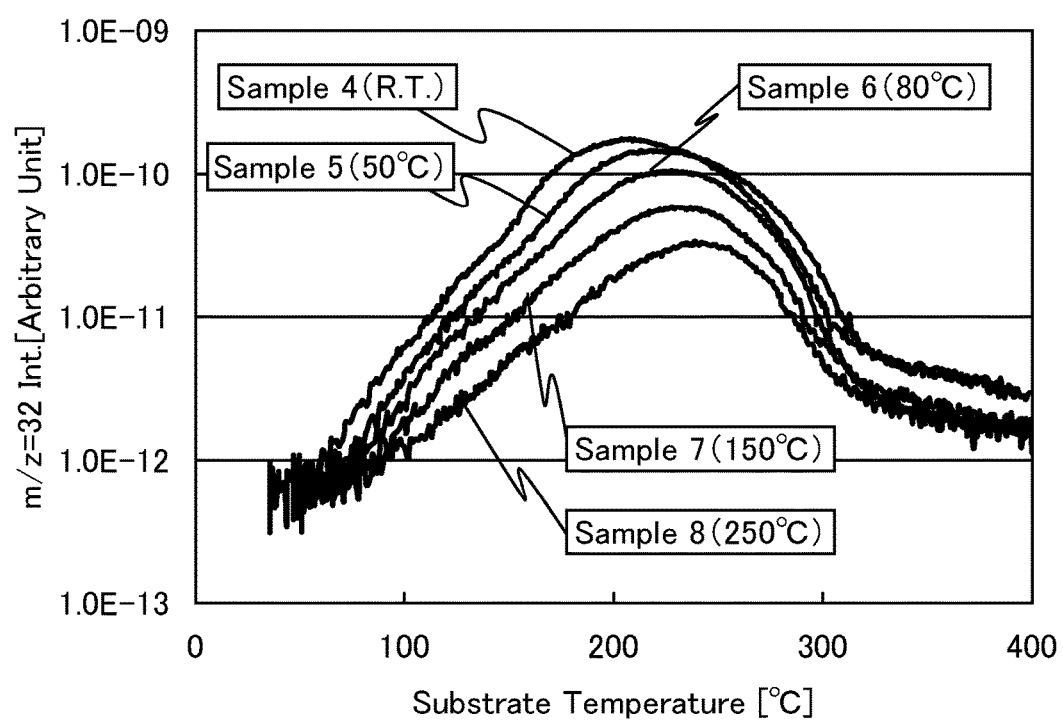
FIG. 11 is a diagram showing results of TDS measurement.

FIG. 11 shows TDS measurement results of Samples 4 to 8. Note that in FIG. 11, the vertical axis and the horizontal axis represent substrate temperature (° C.) and ionic strength of m/z=32 (arbitrary unit), respectively.

The ionic strengths of m/z=32 of Samples 4 to 8 were quantified to calculate the amount of released oxygen. As a result of the quantification, the amounts of released oxygen of Samples 4 to 8 were $2.7 \times 10^{20}$ atoms/cm$^3$, $2.2 \times 10^{20}$ atoms/cm$^3$, $1.5 \times 10^{20}$ atoms/cm$^3$, $8.1 \times 10^{19}$ atoms/cm$^3$, and $4.2 \times 10^{19}$ atoms/cm$^3$, respectively.

Here, types of films, deposition conditions (a deposition apparatus, power, substrate temperature), and the amounts of released oxygen of Samples 1 to 8 are shown in Table 1.

and theoretical analysis is performed using the critical angles and the amplitude waveforms. In this example, an aluminum oxide film having an ideal composition of $Al_2O_3$ (Z/A=0.4882 (Z is an atomic number and A is a mass number)) was used as a model for theoretical analysis.

First, evaluation by XRR is described. As samples for evaluation, two aluminum oxide films which can be used as metal oxide films (Samples 9 and 10) were manufactured in different conditions. Details of structures and formation conditions of the samples are described below.
(Sample 9)

An aluminum oxide film was formed over a glass substrate by a sputtering apparatus under the following conditions: $O_2$=50 sccm ($O_2$=100%), deposition power=6 kW (DC-Pulse power source, Pulse=300 kHz), deposition pressure=0.4 Pa, and substrate temperature=room temperature (RT). Note that an aluminum target was used as a sputtering target, and the thickness of the aluminum oxide film was 100 nm. The thickness of the glass substrate was 0.7 mm.
(Sample 10)

An aluminum oxide film was formed over a glass substrate by a sputtering apparatus under the following conditions: $O_2$=300 sccm ($O_2$=100%), deposition power=30 kW (AC), deposition pressure=0.7 Pa, and substrate temperature=150° C. Note that an aluminum target was used as a

TABLE 1

| | Types of Films | Deposition Apparatus | Power Source | Substrate Temperature [° C.] | Amount of Released Oxygen [atoms/cm$^3$] |
|---|---|---|---|---|---|
| Sample 1 | Silicon Nitride | PE-CVD | RF | 200 | Unquantified |
| Sample 2 | Silicon Oxynitride | PE-CVD | RF | 330 | Unquantified |
| Sample 3 | Silicon Oxide | Sputtering | DC-Pulse | R.T. | 4.5E+20 |
| Sample 4 | Silicon Oxide | Sputtering | AC | R.T. | 2.7E+20 |
| Sample 5 | Silicon Oxide | Sputtering | AC | 50 | 2.2E+20 |
| Sample 6 | Silicon Oxide | Sputtering | AC | 80 | 1.5E+20 |
| Sample 7 | Silicon Oxide | Sputtering | AC | 150 | 8.1E+19 |
| Sample 8 | Silicon Oxide | Sputtering | AC | 200 | 4.2E+19 |

According to Table 1, FIGS. 10A to 10C, and FIG. 11, when a silicon oxide film is formed with a sputtering apparatus, an embodiment of an oxygen release type oxide film can be obtained. Further, according to FIG. 11, it is preferable that a substrate temperature be low when a film is formed by sputtering. This is because the amount of released oxygen can be increased.

As described above, the amount of oxygen released from the oxygen release type oxide film is, on the number of oxygen atoms, $1.0 \times 10^{18}$ atoms/cm$^3$ or more, preferably $1.0 \times 10^{19}$ atoms/cm$^3$ or more, further preferably $1.0 \times 10^{20}$ atoms/cm$^3$ or more. When the amount of oxygen released from the oxygen release type oxide film is in the above range, oxygen can be preferably supplied to the oxide semiconductor.

Example 2

In this example, an oxygen release type oxide film and a metal oxide film which can be used as embodiments of the present invention were evaluated. Note that as evaluation methods, an x-ray reflection measurement method and TDS analysis were used.

Note that XRR is a measurement method for measuring the density of a deposited thin film, in which X-rays are incident on a measurement sample to measure critical angles and changes in amplitude waveforms of the incident X-rays sputtering target, and the thickness of the aluminum oxide film was 100 nm. The thickness of the glass substrate was 0.7 mm.

Figure 12:
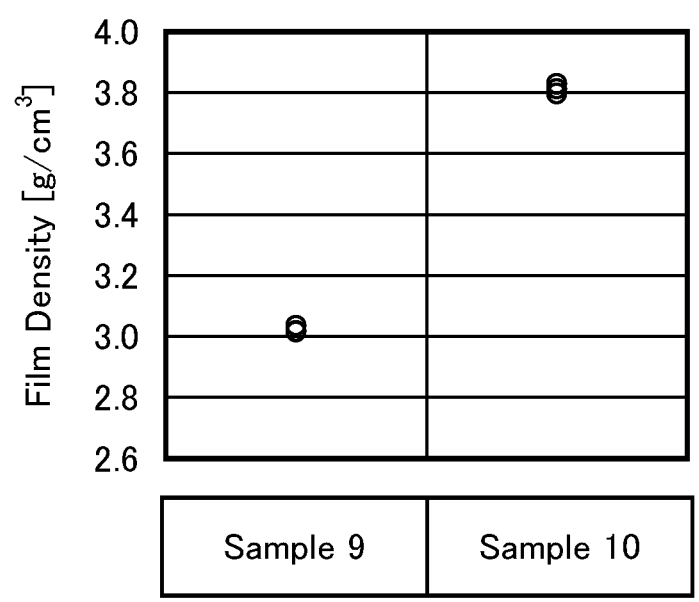
FIG. 12 is a diagram showing results of XRR.

FIG. 12 shows XRR results of Samples 9 and 10. Note that XRR was performed on three points on planes of each sample.

According to FIG. 12, the aluminum oxide film of Sample 9 has a film density of about 3.0 g/cm$^3$, and the aluminum oxide film of Sample 10 has a film density of about 3.8 g/cm$^3$.

Next, evaluation by TDS analysis is described.

As samples for evaluation by TDS analysis in this example, the following two samples were manufactured: a single-layer oxygen release type oxide film and a stacked film of an oxygen release type oxide film and a metal oxide film. The single-layer oxygen release type oxide film was Sample 11 and the stacked film of an oxygen release type oxide film and a metal oxide film was Sample 12.

Note that the oxygen release type oxide film was formed using a silicon oxide film in a condition similar to that of Sample 4 described in Example 1. Further, an aluminum oxide film was used as the metal oxide film and its formation conditions are similar to those of Sample 10 described in this example.

Details of structures and formation conditions of the samples are described below.

(Sample 11)

A silicon oxide film ($SiO_x$) was formed over a glass substrate by a sputtering apparatus under the following conditions: $O_2$=300 sccm ($O_2$=100%), deposition power=24 kW (AC), deposition pressure=0.7 Pa, and substrate temperature=room temperature (RT). Note that the thickness of the glass substrate was 0.7 mm and the thickness of the silicon oxide film was 400 nm. Note that the deposition conditions of Sample 11 in this example are the same as those of Sample 4 in Example 1; however, the thickness is different between Sample 11 and Sample 4 (the thickness of Sample 4 is 100 nm).

(Sample 12)

A silicon oxide film ($SiO_x$) was formed over a glass substrate by a sputtering apparatus under the following conditions: $O_2$=300 sccm ($O_2$=100%), deposition power=24 kW (AC), deposition pressure=0.7 Pa, substrate temperature=room temperature (RT). The thickness of the silicon oxide film was 400 nm. As a metal oxide film, an aluminum oxide film ($AlO_x$) was formed successively in a vacuum after the deposition of the silicon oxide film in the following conditions: $O_2$=300 sccm ($O_2$=100%), deposition power=30 kW (AC), deposition pressure=0.7 Pa, and substrate temperature=150° C. Note that the thickness of the glass substrate was 0.7 mm and the thickness of the aluminum oxide film was 100 nm. The deposition conditions of the aluminum oxide film in this example are the same as those of Sample 10 described above.

Next, TDS analysis was performed on the Samples 11 and 12. Note that TDS analysis is an analysis method in which each sample is heated in a vacuum case and a gas component generated from each sample when the temperature of the sample is increased is detected by a quadrupole mass spectrometer. Detected gas components are distinguished from each other by the ionic strength of m/z (mass/charge). Note that the ionic strength of m/z=32 was identified to oxygen in this example, as in Example 1.

Figure 13:
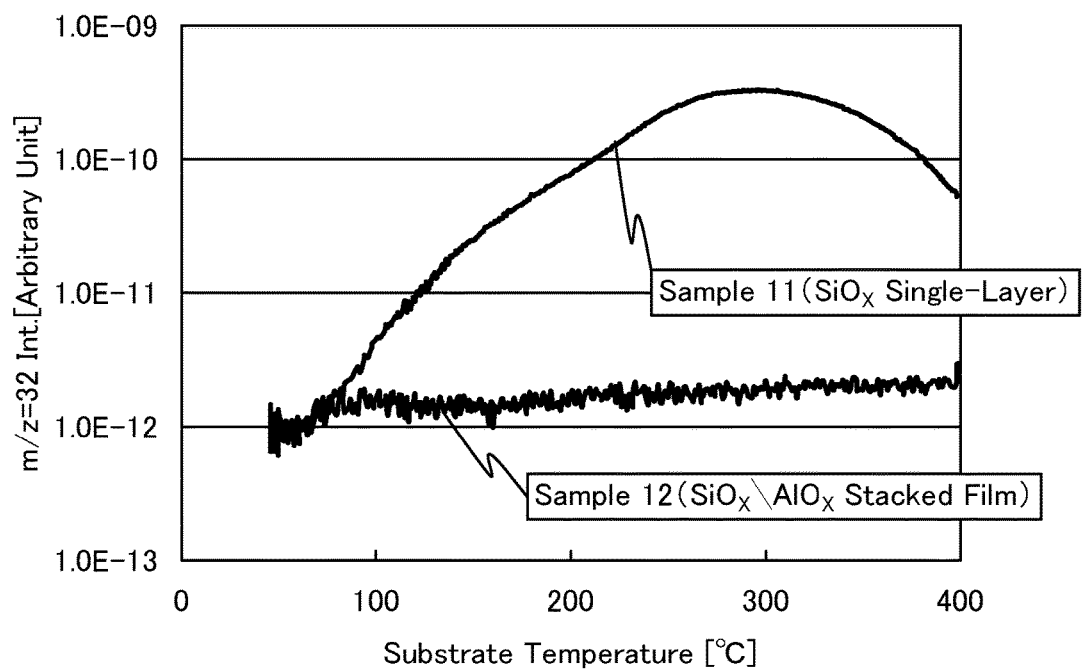
FIG. 13 is a diagram showing results of TDS measurement

FIG. 13 shows TDS measurement results of Samples 11 and 12. Note that in FIG. 13, the vertical axis and the horizontal axis represent substrate temperature (° C.) and ionic strength of m/z=32 (arbitrary unit), respectively.

According to FIG. 13, oxygen is released from the single-layer oxygen release type oxide film (Sample 11) from 100° C. to 400° C. In contrast, oxygen is not frequently released from the stacked film of the oxygen release type oxide film and the aluminum oxide film which is a metal oxide film (Sample 12). Thus, it is confirmed that oxygen release from the oxygen release type oxide film can be suppressed when the aluminum oxide film which is a metal film is formed over the oxygen release type oxide film.

Example 3

In this example, electrical characteristics of a transistor 650 formed by a method for manufacturing a semiconductor device that is one embodiment of the present invention are described.

Figure 14A:
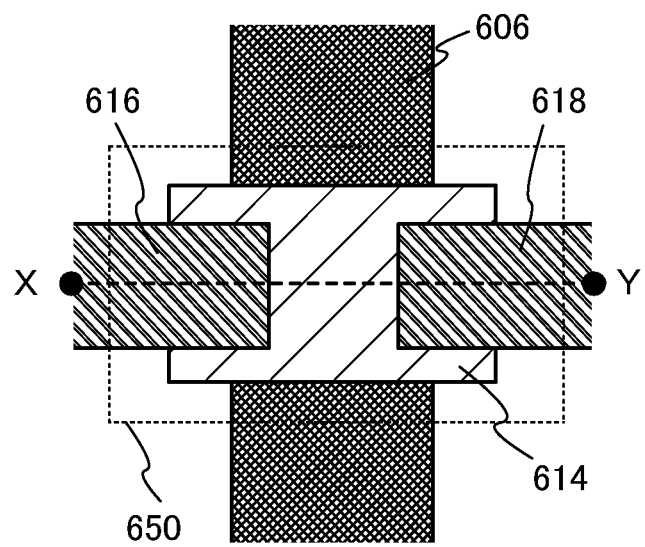
FIGS. 14A and 14B are a top view and a cross-sectional view of a transistor of an embodiment of the present invention.
Figure 14B:
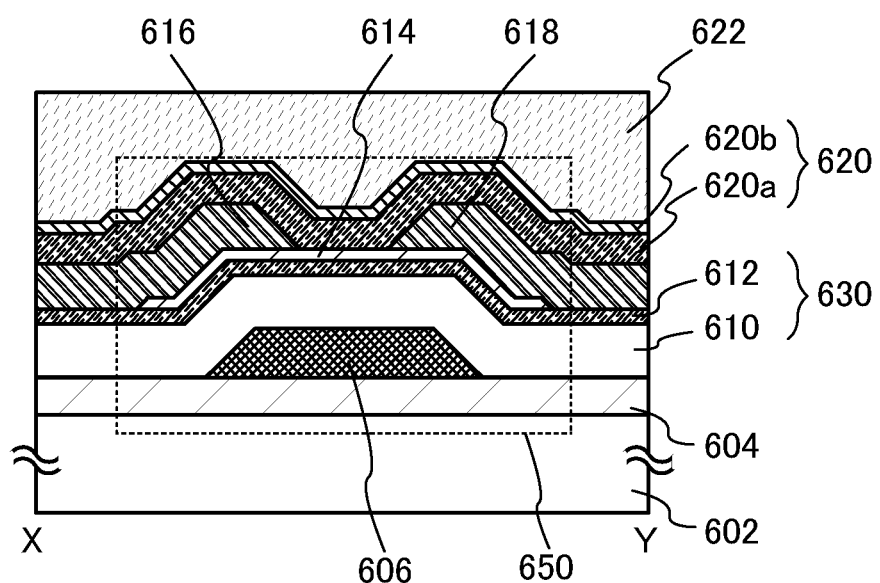

The structure of the transistor 650 in this example is described with reference to FIGS. 14A and 14B. Note that FIG. 14A is a plan view of the transistor 650, and FIG. 14B is a cross-sectional view taken along broken line X-Y of FIG. 14A. In addition, in FIG. 14A, some of components (e.g., a gate insulating film) are omitted in order to avoid complexity of the drawing.

The transistor 650 in FIGS. 14A and 14B includes a substrate 602, a base insulating film 604, a gate electrode 606, a silicon oxynitride film 610, an oxygen release type oxide film 612, an oxide semiconductor film 614, a source electrode 616, and a drain electrode 618. In addition, an inorganic insulating film 620 including an oxygen release type oxide film 620a and a metal oxide film 620b, and an organic insulating film 622 which is formed over the inorganic insulating film 620 are formed over the oxide semiconductor film 614, the source electrode 616, and the drain electrode 618.

In the transistor 650 in FIGS. 14A and 14B, the silicon oxynitride film 610 and the oxygen release type oxide film 612 constitutes a gate insulating film 630.

A method for manufacturing the transistor 650 is described with reference to FIG. 14B.

A 0.7-mm-thick glass substrate was used as the substrate 602. The base insulating film 604 was formed over the substrate 602. The base insulating film 604 has a stacked-layered structure in which a 150-nm-thick silicon oxide film is stacked over a 100-nm-thick silicon nitride film.

Next, a conductive film was deposited over the base insulating film 604 and was subjected to photolithography and etching to form the gate electrode 606. As the gate electrode 606, 100-nm-thick tungsten was formed using a sputtering apparatus.

Next, the silicon oxynitride film 610 was formed over the base insulating film 604 and the gate electrode 606. The silicon oxynitride film 610 was formed using a PE-CVD apparatus in the following conditions: $SiH_4/N_2O/Ar$=250 sccm/2500 sccm/2500 sccm, pressure=30 Pa, substrate temperature=325° C., power=5 kW (frequency: 2.45 GHz and a power source: 4 power sources), distance between an electrode and a substrate=160 mm, and film thickness=80 nm.

Then, first heat treatment was performed at 350° C. for one hour in a nitrogen atmosphere using a baking furnace.

Then, the oxygen release type oxide film 612 and an oxide semiconductor film were successively formed over the silicon oxynitride film 610 in a vacuum.

Note that the oxygen release type oxide film 612 was formed using a silicon oxide film and using a sputtering apparatus. The silicon oxide film was formed using a Si target in the following conditions: substrate temperature=room temperature, oxygen=300 sccm, power=24 kW (AC), pressure=0.7 Pa, and film thickness=20 nm.

Note that the oxygen release type oxide film 612 is similar to the silicon oxide film used as Sample 4 in Example 1. The amount of oxygen released from the oxygen release type oxide film 612 is $23\times10^{20}$ atoms/cm$^3$.

Note that the oxide semiconductor film was formed using a sputtering apparatus and an IGZO target ($In_2O_3$:$Ga_2O_3$:ZnO=1:1:2 [molar ratio]) in the following conditions; substrate temperature=170° C., pressure=0.6 Pa, and power=5 kW (AC). Note that the thickness of the oxide semiconductor film was 35 nm.

Then, the oxide semiconductor film was subjected to photolithography and etching and was processed into the oxide semiconductor film 614.

Next, second heat treatment was performed at 350° C. for one hour in a nitrogen atmosphere using the baking furnace, and then, third heat treatment was performed at 350° C. for one hour in a nitrogen and oxygen atmosphere using the baking furnace.

Then, a conductive film was formed over the oxygen release type oxide film 612 and the oxide semiconductor film 614 and was subjected to photolithography and etching to be processed into the source electrode 616 and the drain electrode 618. The source electrode 616 and the drain electrode 618 had a three-layer structure of a 50-nm-thick tungsten, a 400-nm-thick aluminum, and a 100-nm-thick titanium.

Next, fourth heat treatment was performed at 300° C. for one hour in a nitrogen atmosphere using the baking furnace, and then, the inorganic insulating film 620 was formed. Note that the oxygen release type oxide film 620*a* and the metal oxide film 620*b* were successively formed in a vacuum to form the inorganic insulating film 620. The oxygen release type oxide film 620*a* was formed using a silicon oxide film with a sputtering apparatus. The silicon oxide film was formed using a Si target in the following conditions: substrate temperature=room temperature, oxygen=300 sccm, pressure=0.7 Pa, and film thickness=400 nm. The metal oxide film 620*b* was formed using an aluminum oxide film with a sputtering apparatus. An aluminum oxide film ($AlO_x$) was formed using an aluminum target in the following conditions: substrate temperature=150° C., $O_2$=300 sccm ($O_2$=100%), deposition power=30 kW (AC), deposition pressure=0.7 Pa, and film thickness=50 nm. The density of the aluminum oxide film was 3.8 g/cm$^3$.

Next, the organic insulating film 622 was formed over the inorganic insulating film 620. The organic insulating film 622 was formed to a thickness of 1.5 μm by a spin coating method using acrylic.

Then, fifth heat treatment was performed at 250° C. for one hour in a nitrogen atmosphere using the baking furnace.

Through the above-described steps, the transistor 650 was formed. Note that the transistor 650 in this example had a channel length (L) of 3 μm and a channel width (W) of 3 μm.

Next, electrical characteristics of the transistor 650 which is one embodiment of the present invention were measured. The measurement results of the electrical characteristics of the transistor 650 are shown in FIG. 15.

Figure 15:
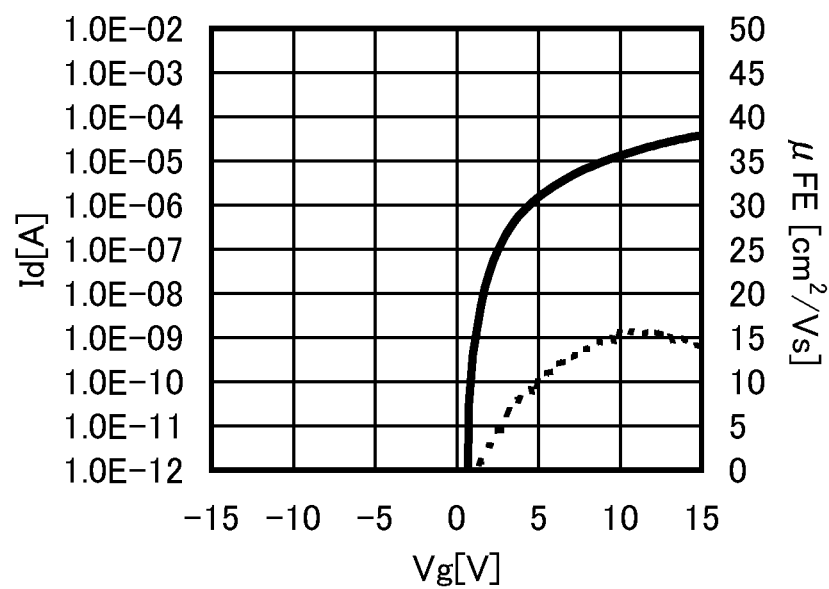
FIG. 15 is a diagram showing results of electric measurement of a transistor of an embodiment of the present invention.

In the results of the electric measurement shown in FIG. 15, a solid line indicates a drain current (Id)-gate voltage (Vg) characteristics obtained by changing a gate voltage (Vg) from −15 V to 15 V by 0.25 V when a voltage (Vd) between a source electrode and a drain electrode of a transistor is 10 V. A dashed line indicates field effect mobility (μFE) obtained by changing a gate voltage (Vg) from −15 V to 15 V by 0.25 V when the voltage (Vd) between the source electrode and the drain electrode of a transistor is 10 V.

According to FIG. 15, the maximum field-effect mobility (μFE) of the transistor 650 which is one embodiment of the present invention in a saturation region is 15.7 cm$^2$/V·s in the case where the voltage between the source electrode and the drain electrode (Vd) is 10 V and the gate voltage (Vg) is changed from −15 V to 15 V. In addition, it is confirmed that the transistor 650 is a normally-off transistor when Vg is 0 V.

As described above, the transistor 650 which is one embodiment of the present invention is a normally-off transistor having high mobility.

This example can be implemented in combination with any of the embodiments and the other examples as appropriate.

This application is based on Japanese Patent Application serial No. 2011-189739 filed with Japan Patent Office on Aug. 31, 2011, the entire contents of which are hereby incorporated by reference.

What is claimed is:

1. A semiconductor device comprising:
a gate electrode;
a gate insulating film over the gate electrode;
an oxide semiconductor film over the gate insulating film;
a source electrode and a drain electrode in electrical contact with the oxide semiconductor film; and
an inorganic insulating film over the oxide semiconductor film, the source electrode, and the drain electrode,
wherein the gate insulating film comprises at least a silicon oxynitride film and a first oxygen release type oxide film over the silicon oxynitride film,
wherein the inorganic insulating film comprises at least a second oxygen release type oxide film and a metal oxide film over the second oxygen release type oxide film,
wherein the metal oxide film comprises aluminum oxide,
wherein the metal oxide film comprising the aluminum oxide has a film density of higher than or equal to 3.2 g/cm$^3$ measured by Rutherford backscattering spectrometry,
wherein an amount of oxygen released from each of the first oxygen release type oxide film and the second oxygen release type oxide film, which is converted to oxygen atoms is greater than or equal to 1×10$^{20}$ atoms/cm$^3$ in a thermal desorption spectroscopy, and
wherein the oxide semiconductor film is formed in contact with the first oxygen release type oxide film.

2. The semiconductor device according to claim 1,
wherein each of the first oxygen release type oxide film and the second oxygen release type oxide film comprises silicon oxide.

3. The semiconductor device according to claim 1,
wherein the oxide semiconductor film comprises at least one of oxides of indium, zinc, gallium, zirconium, tin, gadolinium, titanium, and cerium.

4. The semiconductor device according to claim 1,
wherein the gate electrode comprises at least one element selected from molybdenum, titanium, tantalum, tungsten, aluminum, copper, neodymium, and scandium.

5. The semiconductor device according to claim 1,
wherein a thickness of the metal oxide film is greater than or equal to 50 nm and less than or equal to 100 nm.

6. The semiconductor device according to claim 1, wherein the first oxygen release type oxide film has lower hydrogen concentration than the silicon oxynitride film.

7. A semiconductor device comprising:
a gate electrode;
a gate insulating film over the gate electrode;
an oxide semiconductor film over the gate insulating film;
a source electrode and a drain electrode in electrical contact with the oxide semiconductor film;
an inorganic insulating film over the oxide semiconductor film, the source electrode, and the drain electrode;
an organic insulating film over the inorganic insulating film; and
wherein the gate insulating film comprises at least a silicon oxynitride film and a first oxygen release type oxide film over the silicon oxynitride film,
wherein the inorganic insulating film comprises at least a second oxygen release type oxide film and a metal oxide film over the second oxygen release type oxide film,
wherein the first oxygen release type oxide film is a film of SiOx where x>2,
wherein a thickness of the silicon oxynitride film is thicker than that of the first oxygen release type oxide film,
wherein the oxide semiconductor film is formed in contact with the first oxygen release type oxide film,
wherein the metal oxide film comprises aluminum oxide, wherein the metal oxide film comprising the aluminum oxide has a film density of higher than or equal to 3.2 g/cm$^3$ measured by Rutherford backscattering spectrometry, and wherein an amount of oxygen released from each of the first oxygen release type oxide film and the second oxygen release type oxide film, which is converted to oxygen atoms is greater than or equal to 1×10$^{20}$ atoms/cm$^3$ in a thermal desorption spectroscopy.

8. The semiconductor device according to claim 7, wherein the oxide semiconductor film comprises at least one of oxides of indium, zinc, gallium, zirconium, tin, gadolinium, titanium, and cerium.

9. The semiconductor device according to claim 7, wherein the gate electrode comprises at least one element selected from molybdenum, titanium, tantalum, tungsten, aluminum, copper, neodymium, and scandium.

10. The semiconductor device according to claim 7, wherein a thickness of the metal oxide film comprising the aluminum oxide is greater than or equal to 50 nm and less than or equal to 100 nm.

11. The semiconductor device according to claim 7, wherein the first oxygen release type oxide film has lower hydrogen concentration than the silicon oxynitride film.

\* \* \* \* \*